US008357954B2

(12) United States Patent
Samuelson et al.

(10) Patent No.: US 8,357,954 B2
(45) Date of Patent: Jan. 22, 2013

(54) FORMATION OF NANOWHISKERS ON A SUBSTRATE OF DISSIMILAR MATERIAL

(75) Inventors: Lars Ivar Samuelson, Malmo (SE); Thomas M. I. Martensson, Malmo (SE)

(73) Assignee: QuNano AB, Lund (SE)

( * ) Notice: Subject to any disclaimer, the term of this patent is extended or adjusted under 35 U.S.C. 154(b) by 0 days.

(21) Appl. No.: 13/108,232

(22) Filed: May 16, 2011

(65) Prior Publication Data

US 2011/0215297 A1    Sep. 8, 2011

Related U.S. Application Data

(60) Division of application No. 12/423,384, filed on Apr. 14, 2009, now Pat. No. 7,960,260, which is a continuation of application No. 11/165,126, filed on Jun. 24, 2005, now Pat. No. 7,528,002.

(60) Provisional application No. 60/582,513, filed on Jun. 25, 2004.

(51) Int. Cl.
*H01L 29/06* (2006.01)

(52) U.S. Cl. ... 257/200; 257/615; 257/627; 257/E29.07; 977/762; 977/818

(58) Field of Classification Search .............. 257/E29.07
See application file for complete search history.

(56) References Cited

U.S. PATENT DOCUMENTS

| 5,196,396 | A | 3/1993  | Lieber          |
|-----------|---|---------|-----------------|
| 5,252,835 | A | 10/1993 | Lieber et al.   |
| 5,314,569 | A | 5/1994  | Pribat et al.   |
| 5,332,910 | A | 7/1994  | Haraguchi et al.|
| 5,362,972 | A | 11/1994 | Yazawa et al.   |
| 5,381,753 | A | 1/1995  | Okajima et al.  |
| 5,544,617 | A | 8/1996  | Terui et al.    |
| 5,840,435 | A | 11/1998 | Lieber et al.   |
| 5,858,862 | A | 1/1999  | Westwater et al.|
| 5,897,945 | A | 4/1999  | Lieber et al.   |
| 5,899,734 | A | 5/1999  | Lee             |
| 5,976,957 | A | 11/1999 | Westwater et al.|
| 5,997,832 | A | 12/1999 | Lieber et al.   |
| 6,130,142 | A | 10/2000 | Westwater et al.|

(Continued)

FOREIGN PATENT DOCUMENTS

| EP | 0 443 920 | 8/1991 |
|----|-----------|--------|
| EP | 0 838 865 | 4/1998 |

(Continued)

OTHER PUBLICATIONS

U.S. Appl. No. 10/613,071, filed Jul. 7, 2003, Samuelson et al.

(Continued)

*Primary Examiner* — Stephen W Smoot
(74) *Attorney, Agent, or Firm* — The Marbury Law Group PLLC

(57) ABSTRACT

A method for forming a nanowhisker of, e.g., a III-V semiconductor material on a silicon substrate, comprises: preparing a surface of the silicon substrate with measures including passivating the substrate surface by HF etching, so that the substrate surface is essentially atomically flat. Catalytic particles on the substrate surface are deposited from an aerosol; the substrate is annealed; and gases for a MOVPE process are introduced into the atmosphere surrounding the substrate, so that nanowhiskers are grown by the VLS mechanism. In the grown nanowhisker, the crystal directions of the substrate are transferred to the epitaxial crystal planes at the base of the nanowhisker and adjacent the substrate surface. A segment of an optically active material may be formed within the nanowhisker and bounded by heterojunctions so as to create a quantum well wherein the height of the quantum well is much greater than the thermal energy at room temperature, whereby the luminescence properties of the segment remain constant without quenching from cryogenic temperatures up to room temperature.

5 Claims, 4 Drawing Sheets

U.S. PATENT DOCUMENTS

| | | | |
|---|---|---|---|
| 6,130,143 | A | 10/2000 | Westwater et al. |
| 6,159,742 | A | 12/2000 | Lieber et al. |
| 6,190,634 | B1 | 2/2001 | Lieber et al. |
| 6,286,226 | B1 | 9/2001 | Jin |
| 6,307,241 | B1 | 10/2001 | Awschalom et al. |
| 6,322,713 | B1 | 11/2001 | Choi et al. |
| 6,340,822 | B1 | 1/2002 | Brown et al. |
| 6,559,468 | B1 | 5/2003 | Kuekes et al. |
| 6,586,965 | B2 | 7/2003 | Kuekes |
| 6,716,409 | B2 | 4/2004 | Hafner et al. |
| 6,743,408 | B2 | 6/2004 | Lieber et al. |
| 7,014,737 | B2 | 3/2006 | Harutyunyan et al. |
| 7,223,444 | B2 | 5/2007 | Deppert et al. |
| 7,335,908 | B2 | 2/2008 | Samuelson et al. |
| 7,354,850 | B2 | 4/2008 | Seifert et al. |
| 7,745,813 | B2 * | 6/2010 | Samuelson et al. ............. 257/12 |
| 2002/0129761 | A1 | 9/2002 | Takami |
| 2002/0130311 | A1 | 9/2002 | Lieber et al. |
| 2002/0172820 | A1 | 11/2002 | Majumdar et al. |
| 2002/0175408 | A1 | 11/2002 | Majumdar et al. |
| 2003/0089899 | A1 | 5/2003 | Lieber et al. |
| 2003/0102444 | A1 | 6/2003 | Deppert et al. |
| 2003/0121764 | A1 | 7/2003 | Yang et al. |
| 2003/0200521 | A1 | 10/2003 | DeHon et al. |
| 2004/0075464 | A1 * | 4/2004 | Samuelson et al. ............. 326/37 |
| 2004/0213307 | A1 | 10/2004 | Lieber et al. |
| 2005/0006673 | A1 | 1/2005 | Samuelson et al. |
| 2005/0011431 | A1 | 1/2005 | Samuelson et al. |
| 2005/0017171 | A1 | 1/2005 | Samuelson et al. |
| 2005/0161662 | A1 | 7/2005 | Majumdar et al. |
| 2006/0057360 | A1 | 3/2006 | Samuelson et al. |
| 2006/0125056 | A1 | 6/2006 | Samuelson et al. |
| 2007/0206488 | A1 | 9/2007 | Thelander et al. |
| 2007/0228583 | A1 | 10/2007 | Islam et al. |

FOREIGN PATENT DOCUMENTS

| | | |
|---|---|---|
| EP | 0 544 408 B1 | 1/2000 |
| EP | 1 314 189 | 5/2003 |
| EP | 1 342 075 | 9/2003 |
| JP | 2000-068493 | 3/2000 |
| WO | WO 95/02709 | 1/1995 |
| WO | WO 97/31139 | 8/1997 |
| WO | WO 01/03208 | 1/2001 |
| WO | WO 01/77726 | 10/2001 |
| WO | WO 01/84238 | 11/2001 |
| WO | WO 02/01648 | 1/2002 |
| WO | WO 02/17362 A2 | 2/2002 |
| WO | WO 02/48701 A2 | 6/2002 |
| WO | WO 02/080280 | 10/2002 |
| WO | WO 03/005450 | 1/2003 |
| WO | WO 03/053851 | 7/2003 |
| WO | WO 03/063208 | 7/2003 |
| WO | WO 2004/010552 | 1/2004 |
| WO | WO 2004/038767 | 5/2004 |

OTHER PUBLICATIONS

U.S. Appl. No. 11/812,225, filed Jun. 15, 2007, Samuelson et al.
U.S. Appl. No. 11/812,226, filed Jun. 15, 2007, Samuelson et al.
U.S. Appl. No. 11/868,122, filed Oct. 5, 2007, Samuelson et al.
U.S. Appl. No. 11/922,242, filed Jun. 16, 2006, Wernersson et al.
U.S. Appl. No. 11/922,243, filed Jun. 16, 2006, Wernersson et al.
U.S. Appl. No. 12/003,738, filed Dec. 31, 2007, Samuelson et al.
U.S. Appl. No. 12/003,739, filed Dec. 31, 2007, Samuelson et al.
U.S. Appl. No. 12/003,740, filed Dec. 31, 2007, Samuelson et al.
U.S. Appl. No. 12/003,741, filed Dec. 31, 2007, Samuelson et al.
U.S. Appl. No. 12/003,988, filed Jan. 4, 2008, Seifert et al.
Yazawa, M. et al, "Heteroepitaxial Ultrafine Wire-Like Growth of InAs on GaAs Substrates", *Applied Physics Letters*, Mar. 11, 1991, pp. 1080-1082, vol. 58, No. 10.
Haraguchi, K. et al., "GaAs p-n junction formed in quantum wire crystals", *Applied Physics Letters*, Feb. 10, 1992, pp. 745-747, vol. 60, No. 6.
Yazawa, M., et al., "Effect of one monolayer of surface gold atoms on the epitaxial growth of InAs nanowhiskers", *Applied Physics Letters*, Oct. 26, 1992, pp. 2051-2053, vol. 61.
Yazawa, M., "Nanocolumns composed of GaAs-InAs jointed whiskers and SiO2 covers", *Applied Physics Letters*, Aug. 29, 1994, pp. 1157-1158, vol. 65.
Sato, T., "Site-controlled growth of nanowhiskers", *Applied Physics Letters*, Jan. 9, 1995, pp. 159-161, vol. 66.
Hiruma, K., et al., "Growth and optical properties of nanometerscale GaAs and InAs whiskers", *Applied Physics Review*, Jan. 15, 1995, pp. 447-462, vol. 77.
Hiruma, K., et al., "Growth and Characterization of Nanometer-Scale GaAs, AiGaAs and GaAs/InAs Wires", *IEICE Trans. Electron.*, Sep. 1, 1994, pp. 1420-1425, vol. E77-C, No. 9.
Hiruma, K., et al., "GaAs free-standing quantum-size wires", *Journal of Applied Physics*, Sep. 1, 1993, pp. 3162-3171, vol. 74.
Haraguchi, K., et al., "Polarization dependence of light emitted from GaAs p-n junctions in quantum wire crystals", *Journal of Applied Physics*, Apr. 15, 1994, pp. 4220-4225, vol. 75.
Hiruma, K., et al., Self-organized growth of GaAs/InAs heterostructure nanocylinders by organometallic vapor phase epitaxy, *Journal of Crystal Growth*, Jan. 1, 1996, pp. 226-231, vol. 163.
Lieber, C., "Nanowires as Building Blocks for Nanoscale Science and Technology", *Abstracts of Papers of the Amer. Chem Soc.*, Aug. 18, 2002, pp. 033-Camp Part 1, vol. 224.
Duan, X. et al., "Laser Assisted Catalytic Growth of Single-Crystal Compound Semiconductor Nanowires", *Abstracts of Papers of- the Amer. Chem. Soc.*, Mar. 26, 2000, pp. 676—Inor Part 1, vol. 219.
Duan, X. et al., "Laser Assisted Catalytic Growth of Semiconductor Nanowires for Nanoscale Electronic Optoelectronic Device Application", *Abstracts of Papers of- the Amer. Chem. Soc.*, Apr. 1, 2001, pp. 644—Inor Part 1, vol. 221.
Lieber, C., "Semiconductor Nanowires: Building Blocks for Nanoscale Science and Technology", *Abstracts of Papers of- the Amer. Chem. Soc.*, Aug. 1, 2001, pp. 383—Phys Part 2, vol. 222.
Huang, Y., et al., "Integrated Optoelectronics Assembled from Semiconductor Nanowires", *Abstracts of Papers of- the Amer. Chem. Soc.*, Aug. 18, 2002, pp. 039—Phys Part 2, vol. 224.
Hu, J. et al., "Chemistry and Physics in One Dimension: Synthesis and Properties of Nanowires and Nanotubes", *Acc. Chem. Res.*, Feb. 20, 1999, pp. 435-445, vol. 32, No. 5.
Duan, X. et al., "General Synthesis of Compound Semiconductor Nanowires", *Advanced Materials*, Jan. 1, 2000, pp. 298-302, vol. 12, No. 4.
Duan, X., et al., "Synthesis and optical properties of gallium arsenide nanowires", *Applied Physics Letters*, Feb. 28, 2000, pp. 1116-1118, vol. 76, No. 9.
Cui, Y., et al., "Diameter-controlled synthesis of single-crystal silicon nanowires", *Applied Physics Letters*, Apr. 9, 2001, pp. 2214-2216, vol. 78, No. 15.
Gudiksen, M.S., et al., "Diameter-selective synthesis of semiconductor nanowires", *J. Am. Chem. Soc.*, Aug. 22, 2000, pp. 8801-8802, vol. 122.
Gudiksen, M.S., et al., "Size-Dependent Photoluminescence from Single Indium Phosphide Nanowires", *Journal of Physical Chemistry B*, Mar. 30, 2002, pp. 4036-4039, vol. 106, No. 16.
Duan, X., et al., "Laser-Assisted Catalytic Growth of Single Crystal GaN Nanowires", *Journal of Amer. Chem. Soc.*, Dec. 18, 1999, pp. 188-189, vol. 122, No. 1.
Huang, Y., et al., "Gallium Nitride Nanowire Nanodevices", *Nano Letters*, Jan. 11, 2002, pp. 81-82, vol. 2, No. 2.
Lieber, C., "Nanowire Sugerlattices", *Nano Letters*, Jan. 25, 2002, pp. 82-82, vol. 2, No. 2.
Duan, X., et al., "Nonvolatile Memory and Programmable Logic from Molecule-Gated Nanowires", *Nano Letters*, May 1, 2002, pp. 487-490, vol. 2, No. 5.
Cui, Y., et al., "High Performance Silicon Nanowire Field Effect Transistors", *Nano Letters*, Jan. 1, 2003, pp. 149-152, vol. 3, No. 2.
Zhong, Z., et al., "Synthesis of P-Type Gallium Nitride Nanowires for Electronic and Photonic Nanodevices", *Nano Letters*, Feb. 20, 2003, pp. 343-346, vol. 3, No. 3.
Hu, J., et al., "Controlled Growth and Electrical Properties of Heterojunctions of Carbon Nanotubes and Silicon Nanowires", *Nature*, May 6, 1999, pp. 48-51, vol. 399.

Duan, X., et al., "Indium phosphide nanowires as building blocks for nanoscale electronic and optoelectronic devices", *Nature*, Jan. 4, 2001, pp. 66-69, vol. 409.

Gudiksen, M.S., et al., "Growth of nanawire superlattice structures for nanoscale photonics and electronics", *Nature*, Feb. 7, 2002, pp. 617-620, vol. 415.

Lauhon, L., et al., "Epitaxial Core-Shell and Core-Multishell Nanowire Heterostructures", *Nature*, Nov. 7, 2002, pp. 57-61, vol. 420, No. 6911.

Duan, X., "Single-nanowire electrically driven lasers", *Nature*, Jan. 16, 2003, pp. 241-244, vol. 421.

Lieber, C., "The incredible shrinking circuit", *Sci. Am.*, Sep. 1, 2001, pp. 58-64, vol. 285.

Morales, A., et al., "A Laser Ablation Method for the Synthesis of Crystalline Semiconductor Nanowires", *Science*, Jan. 9, 1998, pp. 208-211, vol. 279.

Cui, Y., et al., "Functional Nanoscale Electronic Devices Assembled Using Silicon Nanowire Building Blocks", *Science*, Feb. 2, 2001, pp. 851-853, vol. 291.

Wang, J., et al., "Highly Polarized Photoluminesence and Photodetection from Single Indium Phosphide Nanowires", *Science*, Aug. 24, 2001, pp. 1455-1457, vol. 293, No. 5534.

Cui, Y., et al., "Nanowire nanosensors for highly sensitive and selective detection of biological and chemical species", *Science*, Aug. 17, 2001, pp. 1289-1292, vol. 293.

Huang, Y., et al., "Logic Gates and Computation from Assembled Nanowire Building Blocks", *Science*, Nov. 9, 2001, pp. 1313-1317, vol. 294.

Cui, Y., et al., "Doping and Electrical Transport in Silicon Nanowires", *The Journal of Physical Chemistry B*, May 11, 2000, pp. 5213-5216, vol. 104, No. 22.

Gudiksen, M.S., et al., "Synthetic Control of the Diameter and Length of Single Crystal Semiconductor Nanowires", *The Journal of Physical Chemistry B*, Apr. 18, 2001, pp. 4062-4064, vol. 105.

Morales, A., et al., "Rational Synthesis of Silicon Nanowires", *INOR*, 651, Jan. 1, 2001.

Wong, E., et al., "Nanobeam Mechanics: Elasticity, Strength, and Toughness of Nanorods and Nanotubes", *Science*, Sep. 26, 1997, pp. 1971-1975, vol. 277.

Dai, H., et al., "Synthesis and Characterization of Carbide Nanorods", *Nature*, Jun. 29, 1995, pp. 769-772, vol. 375.

Junno, T., et al., "Controlled manipulation of nanogarticles with an atomic force microscope", *Applied Physics Letters*, Jun. 26, 1995, pp. 3627-3629, vol. 66.

Zwiller, V., et al., "Single quantum dots emit single photons at a time: Antibunching experiment", *Applied Physics Letters*, Apr. 23, 2001, pp. 2476-2478, vol. 78, No. 17.

Borgstrom, M., et al., "High peak-to-valley ratios observed in InAs/InP resonant tunneling quantum dot stacks", *Applied Physics Letters*, May 21, 2001, pp. 3232-3234, vol. 78, No. 21.

Thelander, et al., "Gold manoparticle single-electron transistor with carbon nanotube leads", *Applied Physics Letters*, Sep. 24, 2001, pp. 2106-2108, vol. 79, No. 13.

Ohlsson, B.J., et al., "Size-, shape-, and position-controlled GaAs nono-whiskers", *Applied Physics Letters*, Nov. 12, 2001, pp. 3335-3337, vol. 79, No. 20.

Bjork, M.T., et al., :One-dimensional heterostructures in semiconductor nanowhiskers, *Applied Physics Letters*, Feb. 11, 2002, pp. 1058-1060, vol. 80, No. 6.

Persson, M.P. et al., "Electronic Structure of Nanometer-Scale GaAs Whiskers", *Applied Physics Letters*, Aug. 12, 2002, pp. 1309-1311, vol. 81, No. 7.

Thelander, C., et al., "Single-Electron Transistors in Heterostructure Nanowires", *Applied Physics Letters*, Sep. 8, 2003, pp. 2052-2054, vol. 83, No. 10.

Panev, N., et al., "Sharp Exciton Emission From Single InAs Quantum Dots in GaAs Nanowires", *Applied Physics Letters*, Sep. 15, 2003, pp. 2238-2240, vol. 83, No. 11.

Bjork, M.T., "Nanowire resonant tunnelling diodes", *Applied Physics Letters*, Dec. 2, 2002, pp. 4458-4460, vol. 81, No. 23.

Persson, A., "Oriented Growth of InAs-based Nanowhiskers", *Diploma Work, Lund Institute of Technology, Lund University*, May 29, 2001, pp. 1-48.

Ohlsson, J., "Semiconductor Hetero- and Nanostructures", *Doctoral Thesis, Lund Institute of Technology, Lund University*, Nov. 23, 2001.

Thelander, C., "Quantum Devices from the Assembly of Zero-and One-Dimensional Building Blocks", *Doctoral Thesis, Lund University*, Nov. 7, 2003.

Ohlsson, B., et al., "Anisotropic GaAs island phase grown on flat Gap: A stranski-Krastanow-formed corrugated surface", *Journal of Applied Physics*, May 15, 2001, pp. 5726-5730, vol. 89, No. 10.

Magnusson, M., et al., "Gold nanogarticles: Production, reshaping, and thermal charging", *Journal of Nanoparticle Research*, Jan. 1, 1999, pp. 243-251, vol. 1.

Samuelson, L., "Self-Forming Nanoscale Devices", *Materials Today*, Oct. 22, 2003, pp. 22-31.

Ohlsson, B., et al., "Fabrication and characterization of III-V nanowhiskers", *MSS10 Conference—Austria*, Jul. 23-27, 2001.

Bjork, M.T., et al., "One-dimensional Steeplechase for Electrons Realized", *Nano Letters*, Jan. 19, 2002, pp. 87-89, vol. 2, No. 2.

Martensson, T., et al., "Fabrication of Individually Seeded Nanowire Arrays by Vapour-Liquid-Solid Growth", *Nanotechnology*, Oct. 17, 2003, pp. 1255-1258, No. 14.

Burgess, D.S., "Nanowire Heterostructures Form Tunneling Diodes", *Photonics Spectra*, pp. 3-5, vol. 37, Feb. 2003.

Pettersson, H., et al., "Electrical and Optical Properties of Self-Assembled InAs Quantum Dots in InP Studied by Space-Charge Spectroscopy and Photoluminescence", *Phys. Rev. B*, Feb. 15, 2000, pp. 4795-4800, vol. 61, No. 7.

Ohlsson, B.J., et al., "Growth and characterization of GaAs and InAs nano-whiskers and InAs/GaAs heterostructures", *Physica E*, Mar. 1, 2002, pp. 1126-1130, No. 13.

Samuelson, L., et al., "Tunnel-Induced Photon Emission in Semiconductors Using an STM", *Physica Scripta*, Jan. 1, 1992, pp. 149-152, vol. T42.

Seifert, W. et al, "In-Situ Growth of Quantum Dot Structures by the Stranski-Krastanow Growth Mode", *Prog. Crys. Growth Charact.*, Jan. 1, 1996, pp. 423-471, vol. 33.

Persson, M., "Tight-Binding Simulation of Nanocrystalline Particles and Whiskers", *Tekn lic thesis, Lund University*, Aug. 1, 2002.

Bjork, M., "Semiconductor Nanowires and Devices", *Tekn lic thesis, Lund University*, Nov. 1, 2002.

Murphy, C.J., et al., "Controlling the Aspect Ratio of Inorganic Nanorods and Nanawires", *Advanced Materials*, Jan. 4, 2002, pp. 80-82, vol. 14, No. 1.

Wagner, R.S., et al., "Vapour-Liquid-Solid Mechanism of Single Crystal Growth", *Applied Physics Letters*, Mar. 1, 1964, pp. 89-90, vol. 4, No. 5.

Canham, L.T., "Silicon Quantum Wire Array Fabrication by Electrochemical and Chemical Dissolution of Wafers", *Applied Physics Letters*, Sep. 3, 1990, pp. 1046-1048, vol. 57.

Koga, T., et al., "Carrier Pocket Engineering Applied to Strained . . . ", *Applied Physics Letters*, Oct. 18, 1999, pp. 2438-2440, vol. 75.

Koga, T., et al., "Experimental Proof-of-Principle Investigation of Enhanced $Z_{3d}T$ in (001) Oriented Si/Ge Superlattices", *Applied Physics Letters*, Sep. 4, 2000, pp. 1490-1492, vol. 77, No. 10.

Narihiro, M., et al., "Resonant tunneling of electrons via 20 nm scale InAs quantum dot and magnetotunneling spectroscopy of its electronic states", *Applied Physics Letters*, Jan. 6, 1997, pp. 105-107, vol. 70, No. 1.

Pan, Z., et al., "Conduction band offset and electron effective mass in GaInNAs/GaAs quantum-well structures with low nitrogen concentration", *Applied Physics Letters*, Apr. 9, 2001, pp. 2217-2219, vol. 78, No. 15.

Ferry, D.K., et al., "Transport in Nanostructures", *Cambridge University Press*, Hardcover, Jan. 1, 1997, pp. 41-45 and 91-96.

Givargizov, E., "Growth of Whiskers by the Vapor-Liquid-Solid Mechanism", *Current Tonics in Material Science*, edited by E. Kaldis, Jan. 1, 1978, pp. 79-145, Chapter 3, vol. 1.

Mullins, J., "News analysis: using unusable frequencies", *IEEE Spectrum*, Jul. 1, 2002, pp. 22-23, vol. 39, No. 7.

Randall, J.N., et al., "Quantum Dot Devices", in Norman G. Einsgruch and William R. Frensley, eds., Heterostructures and Quantum Devices (San Diego, CA: Academic Pres, Inc., 1994) Copyright 1994, p. 420.

Markowitz, P.D., et al., "Phase Separation in Al$_x$Ga$_{1-x}$As Nanowhiskers Grown by the Solution-Liquid-Solid Mechanism", *J. Am. Chem. Soc.*, Apr. 18, 2001, pp. 4502-4511, vol. 123.

Hickmott, T.W., et al., "Negative Charge, Barrier Heights, and the Conduction-Ban Discontinuity in Al$_x$Ga$_{1-x}$As Capacitors", *Journal of Applied Physics*, Apr. 15, 1985, pp. 2844-2853, vol. 57.

Matthews, J., et al., "Defects in Epitaxial Multilayers", *Journal of Crystal Growth*, Jan. 1, 1974, pp. 118-125, vol. 27.

Kovtyukhova, N., et al., "Layer-by-Layer Assembly Rectifying Junctions in and on Metal Nanowires", *Journal of Physical Chemistry B*, Aug. 14, 2001, pp. 8762-8769, vol. 105.

Sakaki, H., "Scattering Suppression and High-Mobility Effect of Size-Quantized Electrons in Ultrafine Semiconductor Wire Structures", *Japanese Journal of Applied Physics*, Dec. 1, 1980, pp. L735-L738, vol. 19, No. 12.

Scheibel, H., et al., "Generation of Monodisperse Ag- and NaCl Aerosols With Particle Diameters Between 2 and 300 nm", *Journal of Aerosol Science*, Jan. 1, 1983, pp. 113-126, vol. 14, No. 2.

Knutson, E., et al., "Aerosol Classification by Electric Mobility: Apparatus, Theory, and Applications", *Journal of Aerosol Science*, Jan. 1, 1975, pp. 443-451, vol. 6.

Miller, M., et al., "Serpentine Superlattice: Concept and First Results", *Journal of Crystal Growth*, Jan. 1, 1991, pp. 323-327, vol. 111.

Bhat, R., et al., "Patterned Quantum Well Heterostructures Grown by OMCVD on Non-Planar Substrates: Applications to Extremely Narrow SQW Lasers", *Journal of Crystal Growth*, Jan. 1, 1988, pp. 850-856.

Hara, S., et al, "Formation and Photoldnescence Characterization of Quantum Well Wires Using Multiatdc Steps Grown by Metalorganic Vapor Phase Epitaxy", *Journal of Crystal Growth*, Jan. 1, 1994, pp. 692-697, vol. 145.

Givargizov, E.I., "Fundamental Aspects of VLS Growth", *Journal of Crystal Growth*, Jan. 1, 1975, pp. 20-30, vol. 31.

Derycke, V., et al., "Carbon Nonotube Inter- and Intramolecular Logic Gates", *Nano Letters*, Aug. 26, 2001, pp. 453-456, vol. 1, No. 9.

Iijima, S., "Helical microtubules of graphitic carbon", *Nature*, Nov. 7, 1991, pp. 56-58, vol. 354.

Yao, Z., et al., "Carbon Nanotube Intramolecular Junctions", *Nature*, Nov. 18, 1999, pp. 273-276, vol. 402.

Bennett, C., et al., "Quantum information and computation", *Nature*, Mar. 16, 2000, pp. 247-255, vol. 404.

Michler, P. et al., "Quantum correlation among photons from a single quantum dot at room temperature", *Nature*, Aug. 31, 2000, pp. 968-970, vol. 406, No. 6799.

Chow, E., et al., "Three-dimensional control of light in a two-dimensional photonic crystal slab", *Nature*, Oct. 26, 2000, pp. 983-986, vol. 407.

Venkatasubramanian, R., et al., "Thin-Film Thermoelectric Devices with High Room-Temperature Figures of Merit", *Nature*, Oct. 11, 2003, pp. 597-602, vol. 413.

Bachtold, A., et al., "Scanned probe microscopy of electronic transport in carbon nanotubes", *Phys. Rev. Lett.*, Jun. 26, 2000, pp. 6082-6085, vol. 84, No. 26.

Hicks, L.D., et al., "Thermoelectric Figure of Merit of a One-Dimensional Conductor", *Physical Review B*, Jun. 15, 1993, pp. 16631-16634, vol. 47, No. 24.

Itskevich, I.E., et al., "Resonant magnetotunneling through individual self-assembled InAs quantum dots", *Physical Review B*, Dec. 15, 1996, pp. 16401-16404, vol. 54, No. 23.

Reed, M.A., et al., "Observation of Discrete Electronic States in a Zero-Dimensional Semiconductor Nanostructure", *Physical Review Letters*, Feb. 8, 1988, pp. 535-537, vol. 60, No. 6.

Kapon, E., et al., "Stimulated Emission in Semiconductor Quantum Wire Heterostructures", *Physical Review Letters*, Jul. 24, 1989, pp. 430-433, vol. 63, No. 4.

Santori, C., et al., "Triggered Single Photons from a Quantum Dot", *Physical Review Letters*, Feb. 19, 2001, pp. 1502-1505, vol. 86, No. 8.

Capasso, F., et al., "Quantum Cascade Lasers", *Physics Today*, May 1, 2002, pp. 34-40.

Likharev, K.K., "Single-Electron Devices and their Applications", *Proceedings of the IEEE*, Apr. 1, 1999, pp. 606-632, vol. 87, No. 4.

Han, W., et al., "Synthesis of Gallium Nitride Nanorods Throuah a Carbon Nanotube-Confined Reaction", *Science*, Aug. 29, 1997, pp. 1287-1289, vol. 277.

Zhang, Y., et al., "Heterostructures of Single-Walled Carbon Nanotubes and Carbide Nanorods", *Science*, Sep. 10, 1999, pp. 1719-1722, vol. 285.

Holmes, J., et al., "Control of Thickness and Orientation of Solution-Grown Silicon Nanowires", *Science*, Feb. 25, 2000, pp. 1471-1473, vol. 287.

Zhou, C.W., et al., "Modulated chemical doping of individual carbon nanotubes", *Science*, Nov. 24, 2000, pp. 1552-1555, vol. 290.

Favier, F., et al., "Hydrogen Sensors and Switches from Electrodeposited Palladium Mesowire Arrays", *Science*, Sep. 21, 2001, pp. 2227-2231, vol. 293.

Bachtold, A., et al., "Logic circuits with carbon nanotube transistors", *Science*, Nov. 9, 2001, pp. 1317-1320, vol. 294.

Nicewarner-Pena, S.R., et al., "Submicrometer metallic barcodes", *Science*, Oct. 5, 2001, pp. 137-141, vol. 294.

Service, R.F., "Nanowire Fabricators Earn Their Stripes", *Science*, Jan. 1, 2002, pp. 946-947, vol. 295, No. 5557.

Awschalom, D.D. et al., "Spintronics", *Scientific American*, Jun. 1, 2002, pp. 66-73, vol. 286, No. 6.

Henning, P., et al., "Compositional information from amorphous Si-Ge multilayers using high-resolution electron microscopy imaging and direct digital recording", *Ultramicroscopy*, Jan. 1, 1996, pp. 221-235, vol. 66.

Wagner, R.S., "VLS Mechanism of Crystal Growth", *Whisker Technology*, A.P. Levitt, ed., Chapter 3, Jan. 1, 1970, pp. 47-119.

Alferov, Z., et al., "For developing semiconductor heterostructures used in high-speed-and opto-electronics", Nov. 23, 2000, www.nobel.se.physics/laureates/2000/.

Von Klitzing, K., "for the discovery of the quantized Hall effect", Jun. 16, 2000, www.nobel.se/physics/laureates/1985/.

Laughlin, R.B., et al., "For their discovery of a new form of quantum fluid with frictionally charged excitations", Jun. 16, 2000, www.nobel.se/physics/laureates/1998/.

Oda, Y., et al., "Natural Formation of Square Scale Structures on Patterned Vicinal Substrates by MOVPE: Application to the Fabrication of Quantum Structures", *Phys. Conf. Ser.*, No. 166, Chapter 4, Aug. 22-26, 1999, pp. 191-194.

Hayakawa, K., et al., "AlGaAs Nano-Meter Scale Network Structures Fabricated by Selective Area MOVPE", *Phys. Conf. Ser.*, No. 162, Chapter 8, Oct. 12-16, 1998.

Akabori, M., et al., "Selective Area MOVPE Growth of Two-Dimensional Photonic Crystals Having an Air-Hole Array and its Application to Air-Bridge-Type structure", *Physica E*, No. 13, Jan. 1, 2002, pp. 446-450.

Melechko, A.V., et al., "Large-Scale Synthesis of Arrays of High-Aspect-Ratio Rigid Vertically Aligned Carbon Nanofibres", *Nanotechnology*, No. 14, Aug. 19, 2003, pp. 1029-1035.

Kempa, K., et al., "Photonic Crystals Based on Periodic Arrays of Aligned Carbon Nanotubes", *Nano Letters*, Nov. 19, 2002, pp. 13-18, vol. 3, No. 1.

Takahashi, H., et al., "Formation and Characteristics of 100 nm Scale GaAs Quantum Wires by Selective Area MOVPE", *Applied Surface Science*, No. 216, Jan. 1, 2003, pp. 402-406.

Akabori, M., et al., "InGaAs Nano-Pillar Array Formation on Partially Masked InP(111)B by Selective Area Metal-Organic Vapour Phase Egitaxial Growth for Two-Dimensional Photonic Crystal Application", *Nanotechnology*, No. 14, Aug. 27, 2003, pp. 1071-1074.

Kamins, T.I., et al., "Self-Assembled Silicon Nanowires for Integrating Microsystems, Nanoelectronics and Microelectronics", *mstnews*, Mar. 2003, Mar. 1, 2003.

Wu, Y., et al., "Rational Synthesis of Inorganic Nanowires", *Abstracts of Papers in the Amer. Chem. Soc.*, Apr. 1, 2001, pp. 108—Iec Part 1, vol. 221.

Yang, P., et al., "Nanowires from Vapor Condensation and their Assemblies", *Abstracts of Papers in the Amer. Chem. Soc.*, Mar. 26, 2000, pp. 269—Inor Part 1, vol. 219.

Huang, M., et al., "Nanowire Array as Potential 2-d Photonic Bandgap Materials", *Abstracts of Paners in the Amer. Chem. Soc.*, Apr. 1, 2001, pp. 95—Phys Part 2, vol. 221.

Yang, P., et al., "Inorganic Nanowires: Rational Synthesis, Functional Assemblies and Novel Properties", *Abstracts of Papers in the Amer. Chem. Soc.*, Apr. 7, 2002, pp. 343—Inor Part 2, vol. 223.

Gates, B., et al., "Synthesis and Characterization of Crystalline Ag2Se Nanowires through a Template-Engaged Reaction at Room Temperature", *Advanced Fun. Materials*, Oct. 1, 2002, pp. 679-686, vol. 12, No. 10.

Yang, P., et al., "Controlled Growth of ZnO Nanowires and their Optical Properties", *Advanced Functional Materials*, May 2002, pp. 323-331, vol. 12, No. 5.

Wu, Y., et al., "Superconducting MgB2 Nanowires", *Advanced Materials*, Oct. 2, 2001, pp. 1487-1489, vol. 13, No. 19.

Huang, M., et al., "Catalytic Growth of Zinc Oxide Nanowires by Vapor Transport", Advanced Materials, Jan. 16, 2001, pp. 113-116, vol. 13, No. 2.

Wu, Y., et al., "Melting and Welding Semiconductor Nanowires in Nanotubes", *Advanced Materials*, Apr. 4, 2001, pp. 520-523, vol. 13, No. 7.

Zheng, B., et al., "Synthesis of Ultra-Long and Highly Oriented Silicon Oxide Nanowires from Liquid Alloys", *Advanced Materials*, Jan. 16, 2002, pp. 122-124, vol. 14, No. 2.

Kind, H., et al., "Nanowire Ultraviolet Photodetectors and Optical Switches", *Advanced Materials*, Jan. 16, 2002, pp. 158-160, vol. 14, No. 2.

Xia, Y., et al., "Chemistry and Physics of Nanowires", *Advanced Materials*, Mar. 4, 2003, pp. 351-352, vol. 15, No. 5.

Xia, Y., et al., "One-Dimensional Nanostructures: Synthesis, Characterization, and Applications", *Advanced Materials*, Mar. 4, 2003, pp. 353-389, vol. 15, No. 5.

Yan, H., et al., Morphogensis of One-Dimensional ZnO Nano- and Microcrystalsm, *Advanced Materials*, Mar. 4, 2003, pp. 402-405, vol. 15, No. 5.

Wu, Y., et al., "Germanium/Carbon Core-Sheath Nanostructures", *Applied Physics Letters*, Jul. 3, 2000, pp. 43-45, vol. 77, No. 1.

Wu, Y., et al., "Inorganic Semiconductor Nanowires: Rational Growth, Assembly, and Novel Properties", *Chemistry-A European Journal*, Mar. 15, 2002, pp. 1261-1268, vol. 8, No. 6.

Yang, P., et al., "Langmuir-Blodgett Assembly of One-Dimensional Nanostructures", *Chemphyschem*, Jun. 17, 2002, pp. 503-506, vol. 3, No. 6.

Wu, Y., et al., "Direct Observation of Vapor-Liquid-Solid Nanowire Growth", *J. Am. Chem. Soc.*, Mar. 13, 2001, pp. 3165-3166, vol. 123.

Yan, H., et al., "Dendritic Nanowire Ultraviolet Laser Array", *J. Am. Chem. Soc.*, Mar. 29, 2003, pp. 4728-4729, vol. 125, No. 16.

Johnson, J., et al., "Single Nanowire Lasers", *Journal of Physical Chemistry B*, Oct. 23, 2001, pp. 11387-11390, vol. 105, No. 46.

Messer, B., et al., "Microchannel Networks for Nanowire Patterning", *Journal of the Amer. Chem. Soc.*, Sep. 29, 2000, pp. 10232-10233, vol. 122, No. 41.

Song, J., et al., "MMo$_3$Se$_3$ (M=Li+,Na+, Rb+,Cs+, NMe4+) Nanowire Formation via Cation Exchange in Organic Solution", *Journal of the Amer. Chem. Soc.*, Mar. 10, 2001, pp. 9714-9715, vol. 123, No. 39.

Li, Y., et al, "Bismuth Nanotubes: A Rational Low-Temperature Synthetic Route", *Journal of the Amer. Chem. Soc.*, Sep. 14, 2001, pp. 9904-9905, vol. 123, No. 40.

Song, J., et al., "Metal Nanowire Formation Using Mo$_3$Se$_3$-as Reducing and Sacrificing Templates", *Journal of the Amer. Chem. Soc.*, Sep. 26, 2001, pp. 10397-10398, vol. 123, No. 42.

Gates, B., et al., "Single-Crystalline Nanowires of Ag2Se Can Be Synthesized by Templating Against Nanowires of Trigonal Se", *Journal of the Amer. Chem. Soc.*, Oct. 25, 2001, pp. 11500-11501, vol. 123, No. 46.

Wu, Y., et al., "Block-by-Block Growth of Single-Crystalline Si/SiGe Superlattice Nanowires", *Nano Letters*, Jan. 19, 2002, pp. 83-86, vol. 2, No. 2.

Johnson, J., et al., "Near-Field Imaging of Nonlinear Optical Mixing in Single Zinc Oxide Nanowires", *Nano Letters*, Apr. 1, 2002, pp. 279-283, vol. 2, No. 4.

Johnson, J., et al., "Single Gallium Nitride Nanowire Lasers", *Nature Materials*, Sep. 15, 2002, pp. 106-110, vol. 1, No. 2.

Huang, M.H., et al., "Room-Temperature Ultraviolet Nanowire Nanolasers", *Science*, Jun. 8, 2001, pp. 1897-1899.

Wu, Y., et al., "Germanium Nanowire Growth via Sample Vapor Transport", *Chem. Mater*, Mar. 20, 2000, pp. 605-607, vol. 12.

Wu, Y., et al., "Semiconductor Nanowire Array: Potential Substrates for Photocatalysis and Photovoltaics", *Topics in Catalysis*, Apr. 1, 2002, pp. 197-202, vol. 19, No. 2.

Liu J.L., et al., "Gas-source MBE growth of freestanding Si nanowires on Au/S1 substrate", *Superlattices Microstructures*, 1999, pp. 477-479, vol. 25, No. 1-2.

Shimada, et al., "Size, position and direction control on GaAs and InAs nanowhisker growth", *Superlattices and Microstructures*, Dec. 1998, pp. 453-458, vol. 24, No. 6.

Shirai, M., et al., "Gold cluster formation using an atomic force microscope and its applications to GaAs whisker growth", *Superlattices and Microstructures*, Aug. 1998, pp. 157-162, vol. 24, No. 2.

Hiruma, K., et al., "Gas and InAs Nanowire Growth Technology", *Proceedings of the Science and Technology of Atomically Engineered Materials*, Oct. 30, 1995, pp. 563-570.

Westwater, J., et al., "Control of the size and position of silicon nanowires grown via the vapor-liquid-solid technique", *Japanese Journal of Applied Physics*, Part 1, Oct. 1997, pp. 6204-6209, vol. 36.

O'Regan, et al., "A Low-Cost, High-Efficiency Solar Cell Based on Dye-Sensitized Colloidal TiOa Films", *Nature*, Oct. 24, 1991, pp. 737-740, vol. 353.

Jun, et al., "Architectural Control of Magnetic Semiconductor Nanocrystals", *J. Am. Checm Soc.*, Jan. 4, 2002, pp. 615-619, vol. 124, No. 4.

Manna, et al., "Synthesis of Soluble and Processable Rod-, Arrow-, Teardrop-, and Tetrapod-Shaped CdSe Nanocrystals", *J. Am. Chec. Soc.*, Dec. 1, 2000, pp. 12700-12706, vol. 122, No. 51.

Huang, et al., "Directed Assembly of one-dimensional nanostructures into functional networks", *Science*, Jan. 26, 2001, pp. 630-633, vol. 291.

Persson, "Heterointerfaces in III-V semiconductor nanowhiskers", *IEEE*, 2002, pp. 281-283.

Gao, et al., "Self-Assembled Nanowire-Nanoribbon Junction Arrays of ZnO", *The Journal of Physical Chemistry*, Nov. 12, 2002, pp. 12653-12658, vol. 106, No. 49.

Jun, et al., "Controlled Synthesis of Multi-Armed CdS Nanorod Architectures Using Monosurfactant System", *J. Am. Chem. Soc.*, May 5, 2001, pp. 5150-5151, vol. 123.

Poole, et al., "Spatially Controlled, Nanoparticle-Free Growth of InP Nanowires", *Applied Physics Letters*, Sep. 8, 2002, pp. 2055-2057, vol. 83, No. 10.

Hiruma et al., "Quantum Size Microcrystals Grown Using Organametallic Vapor Phase Epitaxy", *Appl. Phys. Lett.*, vol. 59, No. 4, Jul. 22, 1991, pp. 431-433.

Ozaki et al., "Silicon Nanowhiskers Grown on a Hydrogen-Terminated Silicon (111) Surface", *Applied Physics Letters*, vol. 73, No. 25, Dec. 21, 1998, pp. 3700-3702.

Wu et al., "Growth, Branching, and Kinking of Molecular-Beam Epitaxial <110> GaAs Nanowires", *Applied Physics Letters*, vol. 83, No. 16, Oct. 20, 2003, pp. 3368-3370.

Grätzel, "Photoelectrochemical Cells", *Nature*, vol. 414, Nov. 15, 2001, pp. 338-344.

Wang et al., "Nanocrystals Branch Out", *Nature Materials*, vol. 2, Jun. 2003, pp. 385-386.

Manna et al., "Controlled Growth of Tetrapod-Branched Inorganic Nanocrystals", *Nature Materials*, vol. 2, Jun. 2003, pp. 382-385.

Wang et al., "Rational Growth of Branched and Hyperbranched Nanowire Structures", *Nano Letters*, vol. 4, No. 5, Mar. 31, 2004.

Dick et al., "Synthesis of Branched 'Nanotrees' by Controlling Seeding of Multiple Branching Events", *Nature Materials*, vol. 3, May 2, 2004.

Oda et al., "Natural Formation of Square Scale Structures on Patterned Vicinal Substrates by MOVPE: Application to the Fabrication of Quantum Structures", *Inst. Phys. Conf. Ser.*, No. 166, Chapter 4, Aug. 22, 1999, pp. 191-194.

Akabori et al., "Selective Area MOVPE Growth of Two-Dimensional Photonic Crystals Having an Air-Hole Array and its Application to Air-Bridge-Type Structures", *Physica E*, No. 13, 2002, pp. 446-450.

Melechko et al., "Large-Scale Synthesis of Arrays of High-Aspect-Ratio Ridig Vertically Aligned Carbon Nanofibres", *Nanotechnology*, No. 14, Aug. 19, 2003, pp. 1029-1035.

Wu et al., "Single-Crystal Metallic Nanowires and Metal/Semiconductor Nanowire Heterostructures", *Nature*, vol. 430, Jul. 1, 2004, pp. 61-65.

Zhong et al., "Nanowire Crossbar Arrays as Address Decoders for Integrated Nanosystems" *Science*, vol. 302, Nov. 21, 2003, pp. 1377-1379.

McAlpine et al., "High-Performance Nanowire Electronics and Photonics on Glass and Plastic Substrates", *Nano Letters*, vol. 3, No. 11, Oct. 14, 2003, pp. 1531-1535.

Greytak et al., "Growth and Transport Properties of Complementary Germanium Nanowire Field-Effect Transistors", *Applied Physics Letters*, vol. 84, No. 21, May 24, 2004, pp. 4176-4178.

Whang et al., "Large-Scale Hierarchical Organization of Nanowire Arrays for Integrated Nanosystems", *Nano Letters*, vol. 3, No. 9, Aug. 5, 2003, pp. 1255-1259.

McAlpine et al., "Nanoimprint Lithography for Hybrid Plastic Electronics", *Nano Letters*, vol. 3, No. 4, Mar. 7, 2003, pp. 443-445.

Bozovic et al., "Plastic Deformation in Mechanically Strained Single-Walled Carbon Nanotubes", *Physical Review B*, vol. 57, Jan. 22, 2003, pp. 033407-1-033407-4.

Hahm et al., "Direct Ultrasensitive Electrical Detection of DNA and DNA Sequence Variations Using Nanowire Nanosensors", *Nano Letters*, vol. 4, No. 1, Dec. 9, 2003, pp. 51-54.

Lieber, "Nanoscale Science and Technology: Building a Big Future from Small Things", MRS Bulletin, Jul. 2003, pp. 486-491.

Yu et al., "Silicon Nanowires: Preparation, Device Fabrication, and Transport Properties", *J. Phys. Chem. B.*, vol. 104, No. 50, Nov. 23, 2000, pp. 11864-11870.

Law et al., "Photochemical Sensing of $NO_2$ with $SnO_2$ Nanoribbon Nanosensors at Room Temperature", *Angew. Chem. Int. Ed.*, vol. 41, No. 13, 2002, pp. 2405-2408.

Lao et al., "Hierarchical ZnO Nanostructures", *Nano Letters*, vol. 2, Sep. 13, 2002, pp. 1287-1291.

Barrelet et al., "Synthesis of CdS and ZnS Nanowires Using Single-Source Molecular Precursors", *J. Am. Chem. Soc.*, vol. 125, 2003, pp. 11498-11499.

Björk et al., "Few-Electron Quantum Dots in Nanowires", *Nano Letters*, vol. 4, No. 9, Jul. 28, 2004, pp.1621-1625.

Martensson et al., "Nanowire Arrays Defined by Nanoimprint Lithography", *Nano Letters*, vol. 4, Mar. 17, 2004, pp. 699-702.

Hornstra, "Dislocations in the Diamond Lattice", *J. Phys. Checm. Solids*, vol. 5, 1958, pp. 129-141.

Krost et al., "InP on Si(111): Accommodation of Lattice Mismatch and Structural Properties", *Appl. Phys. Lett.*, vol. 64, No. 7, Feb. 7, 1994, pp. 769-771.

Gorbach et al., "Growth of III-V Semiconductor Layers on Si Patterned Substrates", *Thin Solid Films*, vol. 336, 1998, pp. 63-68.

Ohlsson et al., "Anti-Domain-Free GaP, Grown in Atomically Flat (001) Si Sub-μm-sized Openings", *Applied Physics Letters*, vol. 80, No. 24, Jun. 17, 2002, pp. 4546-4548.

Kawanami, "Heteroepitaxial Technologies of III-V on Si", *Solar Energy Materials & Solar Cells*, vol. 66, 2001, pp. 479-486.

Westwater et al., "Growth of Silicon Nanowires Via Gold/Silane Vapor-Liquid-Solid Reaction", *J. Vac. Sci. Technol. B.*, vol. 15, No. 3, 1997, pp. 554-557.

Kamins et al., "Ti-Catalyzed Si Nanowjres by Chemical Vapor Deposition: Microscopy and Growth Mechanisms", *Journal of Applied Physics*, vol. 89, No. 2, Jan. 15, 2001, pp. 1008-1016.

Schubert et al., "Silicon Nanowhiskers Grown on <111> Si Substrates by Molecular-Bean Epitaxy", *Applied Physics Letters*, vol. 84, No. 24, Jun. 14, 2004, pp. 4968-4970.

Kamins et al., "Growth and Structure of Chemically Vapor Deposited Ge Nanowires on Si Substrates", *Nano Letters*, vol. 4, No. 3, Jan. 23, 2004, pp. 503-506.

Thornton et al., "A Photoemission Study of Passivated Silicon Surfaces Produced by Etching in Solutions of HF", *Semicond. Sci. Technol.*, vol. 4, 1989, pp. 847-851.

Borgstrom et al., "Size- and Shape-Controlled GaAs Nano-Whiskers Grown by MOVPE: A Growth Study", *Journal of Crystal Growth*, vol. 260, 2004, pp. 18-22.

Westwater et al., "Si Nanowires Grown Via the Vapour-Liquid-Solid Reaction", *Phys. Stat. Sol.*, vol. (a)165, 1998, pp. 37-42.

Westwater et al., "The Characteristics and Oxidation of Vapor-Liquid-Solid Grown Si Nanowires", *Mat. Res. Soc. Symp. Proc.*, vol. 452, 1997, pp. 237-242.

Westwater et al., "Nanoscale Silicon Whiskers Formed by Silane/Gold Reaction at 335° C.", *Materials Letters*, vol. 24, Jun. 1995, pp. 109-112.

Yang, "Semiconductor Nanowire Array", *Proceedings of the SPIE*, vol. 4806, 2002, pp. 222-224.

Kuykendall et al., "Crystallographic Alignment of High-Density Gallium Nitride Nanowire Arrays", *Nature Materials*, vol. 3, Jul. 25, 2004, pp. 524-528.

Abramson et al., "Fabrication and Characterization of a Nanowire/Polymer-Based Nanocomposite for a Prototype Thermoelectric Device", *Journal of Microelectromechanical Systems*, vol. 13, No. 3, Jun. 2004, pp. 505-513.

Abramson et al., "Nanowire Composite Thermoelectric Devices", *Proceedings of IMECE2002, ASME International Mechanical Engineering Congress & Exposition*, Nov. 17-22, 2002, pp. 7-11.

Johnson et al., "Single Nanowire Waveguides and Lasers", *Proceedings of SPIE*, vol. 5223, 2003, pp. 187-196.

Greene et al., "Low-Temperature Wafer-Scale Production of ZnO Nanowire Arrays", *Angew. Chem. Int. Ed.*, vol. 42, 2003, pp. 3031-3034.

Kim et al., "Nanowire Arrays for Thermoelectric Devices", *Proceedings of HT2003, ASME Summer Heat Transfer Conference*, Jul. 21-23, 2003, pp. 101-104.

Choi et al., "Self-Organized GaN Quantum Wire UV Lasers", *J. Phys. Chem. B.*, vol. 107, 2003, pp. 8721-8725.

Yang, "From Nanowire Lasers to Quantum Wire Lasers", *Proceedings of SPIE*, vol. 5349, 2004, pp. 18-23.

Mikkelsen et al., "Direct Imaging of the Atomic Structure Inside a Nanowire by Scanning Tunneling Microscopy", *Nature Materials*, vol. 3, Jul. 4, 2004, pp. 519-523.

Thelander et al., "Electron Transport in InAs Nanowires and Heterostructure Nanowire Devices", *Solid State Communications*, vol. 131, Jun. 11, 2004, pp. 573-579.

Samuelson et al., "Semiconductor Nanowires for Novel One-Dimensional Devices", *Physica E*, vol. 21, 2004, pp. 560-567.

Shorubalko et al., "Tunable Nonlinear Current-Voltage Characteristics of Three-Terminal Ballistic Nanojunctions", *Applied Physics Letters*, vol. 83, No. 12, Sep. 22, 2003, pp. 2369-2371.

Samuelson et al., "Fabrication and Spectroscopic Studies of InP/GaInAs/Inp and GaAs/GaInAs/GaAs Quantum-Well Wire Structures", *Inst. Phys. Confer. Ser.* No. 127, Chapter 3, Jan. 1, 1992, pp. 95-98.

Samuelson et al., "Fabrication and Imaging of Quantum Well Wire Structures", *SPIE*, vol. 1676, 1992, pp. 154-160.

Larsson et al., "Probing of Individual Semiconductor Nanowhiskers by TEM-STM", *Microscopy and Microanalysis*, vol. 10, 2004, pp. 41-46.

Ramvall et al., Quantized Conductance in a Heterostructurally Defined $Ga_{0.25}In_{0.75}As/InP$, *Appl. Phys. Lett.*, vol. 71, Aug. 18, 1997, pp. 918-920.

Ng et al., "Growth of Epitaxial Nanowires at the Junctions of Nanowalls", *Science*, vol. 300, May 23, 2003, p. 12.

Ng et al., "Epitaxial Single Crystalline Inorganic Nanowires and Nanowalls: Growth Morphogenesis and Applications in Nano-Optoelectronics", *Proceedings of SPIE*, vol. 5349, 2004, pp. 11-17.

Ng et al., "Three Dimensional Columnar Optical Nanostructures Fabricated by Using Lithography-Free Templating Approach", *Applied Physics Letters*, vol. 84, No. 15, Apr. 12, 2004, pp. 2898-2900.

Thelander et al., "One Dimensional Heterostructures and Resonant Tunneling in III-V Nanowires", *IEEE International Symposium on Compound Semiconductors*, Aug. 25, 2003, pp. 151-152.

Björk et al., "Heterostructures in One-Dimensional Nanowires", *Proceedings of 7th International Conference of Nanometer-Scale Science and Technology and 21st European Conference on Surface Science*, Jun. 24, 2002.

Ohlsson et al., "Comparison Between (111)B and (100)III-V Nanowhiskers", Proceedings of 7th International Conference of Nanometer-Scale Science and Technology and 21st European Conference on Surface Science, Jun. 24, 2002.

Larsson et al, In-Situ Manipulations and Electrical Measurements of III-V Nanowhiskers with TEM-STM, Proceedings of 7th International Conference of Nanometer-Scale Science and Technology and 21st European Conference on Surface Science, Jun. 24, 2002.

Persson et al., "Solid-phase-diffusion mechanism for GaAs nanowire growth", *Nature Materials*, vol. 3, Oct. 2004, pp. 677-681.

Ng et al., "Single Crystal Nanowire Vertical Surround-Gate-Field-Effect Transistor", *Nano Letters*, vol. 4, No. 7, May 29, 2004, pp. 1247-1252.

Lieber et al., "Nanowires as Building Blocks for Nanoelectronics and Nanophotonics", *Electron Devices Meeting 2003 IEEE International*, 2003, pp. 12.3.1-12.3.3.

Martensson et al., "Epitaxial-III-V Nanowires on Silicon", *Nano Letters*, vol. 4, No. 10, Sep. 23, 2004, pp. 1987-1990.

Jensen et al., "Role of Surface Diffusion in Chemical Beam Epitaxy of InAs Nanowires", *Nano Letters*, vol. 4, No. 10, Sep. 14, 2004, pp. 1961-1964.

Baluch et al., "Atomic-level robustness of the Si(100)-2x1: H surface following liquid phase chemical treatments in atmospheric pressure environments," *J. Vac. Sci. Technol., A*, May/Jun. 2004, 22(3):L1-L5.

Buriak et al., "Organometallic Chemistry on Silicon and Germanium Surfaces," Chemical Reviews, 2002, 102(5):1272-1308.

Endo et al., "Atomic image of hydrogen-terminated Si(001) surfaces after wet cleaning and its first-principles study," J. Appl. Physics, Apr. 1, 2002, 91(7):4065-4072.

Weldon et al., "The surface science of semiconductor processing: gate oxides in the ever-shrinking transistor," Surface science, 2002, 500:859-878.

\* cited by examiner

Fig. 2A
Fig. 2B
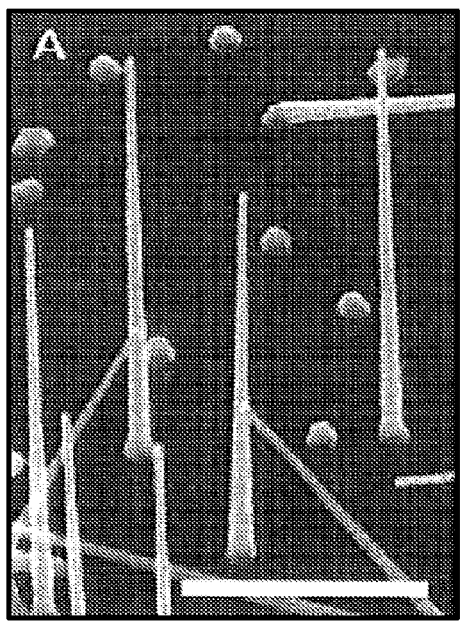
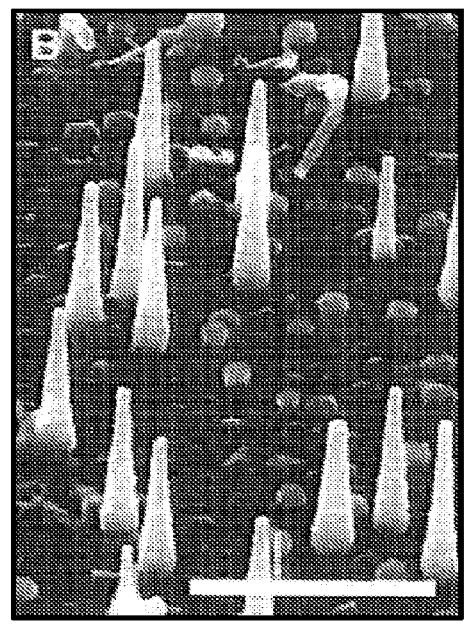

FORMATION OF NANOWHISKERS ON A SUBSTRATE OF DISSIMILAR MATERIAL

CROSS-REFERENCE TO RELATED APPLICATIONS

This application claims the benefit of the priority of U.S. Provisional Patent Application No. 60/582,513 filed Jun. 25, 2004, the entirety of which is incorporated herein by reference.

BACKGROUND OF THE INVENTION

1. Field of the Invention

This invention relates generally to structures produced by techniques of nanotechnology, and methods of producing such structures.

More specifically, the invention relates to such structures and devices incorporating at least one element, essentially in one-dimensional form, which is of nanometer dimensions in its width or diameter, which is produced with the aid of a catalytic particle, and which is commonly termed a "nanowhisker."

The invention relates also to a method of forming a nanowhisker of a certain material on a substrate of a dissimilar material.

2. Brief Description of the Prior Art

Nanotechnology covers various fields, including that of nanoengineering, which may be regarded as the practice of engineering on the nanoscale. This may result in structures ranging in size from small devices of atomic dimensions, to much larger scale structures—for example, on the microscopic scale. Typically, nanostructures are devices having at least two dimensions less than about 1 µm (i.e., nanometer dimensions). Ordinarily, layered structures or stock materials having one or more layers with a thickness less than 1 µm are not considered to be nanostructures. Thus, the term nanostructures includes free-standing or isolated structures that have two dimensions less than about 1 µm, that have functions and utilities different from those of larger structures, and that are typically manufactured by methods different from conventional procedures for preparing somewhat larger, i.e., microscale, structures. Although the exact boundaries of the class of nanostructures are not defined by a particular numerical size limit, the term has come to signify such a class that is readily recognized by those skilled in the art. In many cases, an upper limit of the size of the at least two dimensions that characterize nanostructures is about 500 nm. In some technical contexts, the term "nanostructure" is construed to cover structures having at least two dimensions of about 100 nm or less. In a given context, the skilled practitioner will recognize the range of sizes intended. In this application, the term "nanostructure" is broadly intended to refer to an elongated structure having at least two transverse dimensions less than about 1 µm, as indicated above. In more preferred applications, such dimensions will be less than about 100 nm, more preferably less than about 50 nm, and even more preferably less than about 20 nm.

Nanostructures include one-dimensional nanoelements, essentially in one-dimensional form, that are of nanometer dimensions in their width or diameter, and that are commonly known as nanowhiskers, nanorods, nanowires, nanotubes, etc.

The basic process of whisker formation on substrates by the so-called VLS (vapor-liquid-solid) mechanism is well known. A particle of a catalytic material, usually gold, is placed on a substrate and heated in the presence of certain gases to form a melt. A pillar forms under the melt, and the melt rises up on top of the pillar. The result is a whisker of a desired material with the solidified particle melt positioned on top. See Wagner, *Whisker Technology*, Wiley, New York, 1970, and E. I Givargizov, *Current Topics in Materials Science*, Vol. 1, pages 79-145, North Holland Publishing Company, 1978. In early applications of this technique, the dimensions of such whiskers were in the micrometer range, but the technique has since also been applied for the formation of nanowhiskers. For example, International Patent Application Publication No. WO 01/84238 (the entirety of which is incorporated herein by reference) discloses in FIGS. 15 and 16 a method of forming nanowhiskers, wherein nanometer sized particles from an aerosol are deposited on a substrate and these particles are used as seeds to create filaments or nanowhiskers.

Although the growth of nanowhiskers catalyzed by the presence of a catalytic particle at the tip of the growing whisker has conventionally been referred to as the VLS (Vapor-Liquid-Solid process), it has come to be recognized that the catalytic particle may not have to be in the liquid state to function as an effective catalyst for whisker growth. At least some evidence suggests that material for forming the whisker can reach the particle-whisker interface and contribute to the growing whisker even if the catalytic particle is at a temperature below its melting point and presumably in the solid state. Under such conditions, the growth material, e.g., atoms that are added to the tip of the whisker as it grows, may be able to diffuse through a the body of a solid catalytic particle or may even diffuse along the surface of the solid catalytic particle to the growing tip of the whisker at the growing temperature. Persson et al., "Solid-phase diffusion mechanism for GaAs nanowires growth," *Nature Materials*, Vol. 3, October 2004, pages 687-681, shows that, for semiconductor compound nanowhiskers there may occur solid-phase diffusion mechanism of a single component (Ga) of a compound (GaAs) through a catalytic particle. Evidently, the overall effect is the same, i.e., elongation of the whisker catalyzed by the catalytic particle, whatever the exact mechanism may be under particular circumstances of temperature, catalytic particle composition, intended composition of the whisker, or other conditions relevant to whisker growth. For purposes of this application, the term "VLS process," or "VLS mechanism," or equivalent terminology, is intended to include all such catalyzed procedures wherein nanowhisker growth is catalyzed by a particle, liquid or solid, in contact with the growing tip of the nanowhisker.

For the purposes of this specification the term "nanowhisker" is intended to mean a one-dimensional nanoelement with a width or diameter (or, generally, a cross-dimension) of nanometer size, the element preferably having been formed by the so-called VLS mechanism, as defined above. Nanowhiskers are also referred to in the art as "nanowires" or, in context, simply as "whiskers" or "wires."

Several experimental studies on the growth of nanowhiskers have been made, the most important reported by Hiruma et al. They grew III-V nanowhiskers on III-V substrates in a metal organic chemical vapor deposition (MOCVD) growth system. See Hiruma et al., *J. Appl. Phys.*, 74, page 3162 (1993); Hiruma et al., *J. Appl. Phys.*, 77, page 447 (1995); Hiruma et al., *IEICE Trans. Electron.*, E77C, page 1420 (1994); Hiruma et al., *J. Crystal Growth*, 163, pages 226-231 (1996).

More recently, growth of Si nanowires on Si substrates has been demonstrated. See, e.g., Westwater et al., *J. Vac. Sci. Technol.*, B 1997, 15, page 554. Very recently, growth of Ge nanowires on Si substrates was also demonstrated. See Kamins et al., *Nano Lett.* 2004, 4, pages 503-506, Web published Jan. 23, 2004.

In the prior art in general, many different approaches have been tried in order to realize perfect epitaxial growth of III-V materials on silicon substrates. The primary motivation for these strong efforts is that, if such a technology could be developed, a very wide spectrum of so called III-V heterostructure devices may be incorporated with main-stream silicon technology, thus opening the way to highly advanced high-speed and opto-electronic devices incorporated with silicon.

Besides the efforts toward integrating III-V materials on Si, other approaches toward the specific goal of efficient light-emission using Si have been proposed—for example, the formation of porous Si via electrochemical etching (Canham, L. T., *Appl. Phys. Lett.*, 1990, 57, page 1046) and the incorporation of luminescent defects, such as rare-earth impurities (Michel et al, *Semiconduct. Semimet.*, 1998, 49, page 111.

Epitaxial growth of III-V semiconductors on Si presents a number of difficulties, such as lattice mismatch, differences in crystal structure (III-V's have a polar zinc blende or wurtzite structure whereas Si has a covalent diamond structure), and a large difference in thermal expansion coefficient. Much work has been done on planar growth of layers of III-V materials on Si substrates using different approaches such as buffer layers, growth on patterned Si surfaces, and selected area growth from small openings. See, for example, Kawanami, H., *Sol. Energy Mater. Sol. Cells,* 2001, 66, page 479.

A major challenge has been to avoid the formation of antiphase domains related to the initiation of III-V growth on two atomic planes of silicon differing by one atomic layer, which leads to the formation of anti-phase domain walls and defective material. In Ohlsson et al., "Anti-domain-free GaP, grown in atomically flat (001) Si sub-µm-sized openings", *Appl. Phys. Lett.*, Vol 80, No. 24, 17 Jun. 2002, pages 4546-4548, to address the problem of antiphase domains, GaP nanocrystals were grown on a Si(001) substrate surface through openings in a mask of $SiO_2$. The mask openings were defined by e-beam lithography. Etching and chemical stripping followed, and organic residues were removed by oxygen plasma. A high annealing temperature of 1000° C. was used to remove Si oxide and to provide atomic flatness on the silicon surface on which GaP is nucleated. An atomically flat surface is a surface that presents a single crystal facet and does not exhibit atomic steps.

In prior U.S. patent application Ser. No. 10/613,071, published as No. 2004-0075464, to Samuelson et al., and International Patent Application Publication No. WO-A-04/004927 (both of which publications are incorporated herein by reference), there are disclosed methods of forming nanowhiskers by a chemical beam epitaxy method. Nanowhiskers are disclosed having segments of different materials, with abrupt or sharp heterojunctions therebetween. Structures are disclosed comprising nanowhiskers of, for example, gallium arsenide extending from a silicon substrate. Processes are disclosed for forming epitaxial layers of III-V materials on a silicon substrate, involving initial formation of nanowhiskers on the substrate and using the nanowhiskers as nucleation centers for an epitaxial layer.

Improvements are desirable in the formation of nanowhiskers of III-V materials (or having at least a base portion of III-V material) on a substrate of Group IV material to ensure that the nanowhiskers are grown in a highly reliable way with accurate predetermined dimensions and structure, and with accurately predetermined physical characteristics for implementing the above structures and processes. More generally, improvements are desirable in the formation of nanowhiskers having at least a base portion of a predetermined material on a substrate of a dissimilar material.

SUMMARY OF THE INVENTION

One object of the invention is to provide a method for forming, on a substrate of a Group IV material, a nanowhisker having at least a base portion of a III-V semiconductor material.

A more general object of the invention is to provide a method for forming a nanowhisker, having at least a base portion of a predetermined material, on a substrate of a dissimilar material.

A further object of the invention is to provide a nanostructure comprising a nanowhisker upstanding form a substrate of a Group IV material and having at least a base portion of a III-V semiconductor material.

A further object of the invention is to provide a nanostructure including a nanowhisker formed on a substrate of a Group IV material, the nanowhisker having at least a base portion of a III-V semiconductor material and one or more segments of a further material bounded with abrupt or sharp heterojunctions.

In accordance with a first aspect, the invention provides a method for forming a nanowhisker, having at least a base portion of a first material, on a substrate of a second material, different from said first material, comprising:

providing a substrate of said second material having a surface that is prepared to remove impurities and to provide at least one atomically flat growth region;

providing on said growth region at least one catalytic particle;

introducing into the atmosphere surrounding the substrate, gases for forming the nanowhisker, and heating the substrate to a predetermined growth temperature at which the nanowhisker is grown on said growth region via a said catalytic particle.

In accordance with a more specific aspect, the invention provides a method for forming a nanowhisker, having at least a base portion of a III-V first semiconductor material on a substrate of a Group IV second material, comprising:

providing a substrate of said second material having a surface that is prepared to remove impurities and to provide at least one atomically flat growth region;

providing on said growth region at least one catalytic particle; and introducing into the atmosphere surrounding the substrate, gases for forming the nanowhisker, and heating the substrate to a predetermined growth temperature at which the nanowhisker is grown via a said catalytic particle.

It has been found that an issue in achieving growth of III-V nanowhiskers (i.e., nanowhiskers of which at least the initial growth or base portion is of a III-V material) on a silicon substrate, or other Group IV material, is to provide essentially a perfect surface from which catalytic growth is initiated. In order to provide for the formation of an ideal group III-V (or Group II-VI) semiconductor on the substrate, the interface between the metallic nanoparticle and the substrate has to be of a character that only a single-domain of the crystalline nanowhisker material is formed. This may ideally be obtained by keeping the interface atomically flat over the diameter of the nanowire, or more generally by nucleation conditions that lead to a single nucleus from which the nanowhisker nucleates and grows. Thus, it is desirable to have a totally clean surface that is free from impurity and oxide and that is preferably also atomically flat at the whisker growth site (or at least sufficient that the nanowhisker nucleates and grows from a single nucleus). In this way, growth of the nanowhisker material in bulk form that might occur at imperfections on the substrate surface is inhibited, and factors that promote nanowhisker growth are encouraged, such as migration of nanowhisker material along the surface of the substrate to the catalytic growth particle.

In practice of the invention, it is desirable to employ one or more cleaning operations to remove organic residue that is commonly found on a substrate surface. It is also desirable to employ steps such as etching to remove existing oxide formations on the substrate surface. In order to prevent further oxide growth on the substrate surface, subsequent to these removal steps, it is desirable to passivate the surface, at least temporarily, such as by HF etching.

It would in principle be possible to provide a surface with a layer of passivating material such as silicon nitride or silicon dioxide, and to form apertures in the passivating layer (for example, by etching) and to treat the exposed substrate surface in the apertures to achieve the ideal conditions as described above. Catalytic particles would then be formed within respective apertures by a suitable deposition process.

In a currently preferred embodiment, however, the entire substrate surface is processed towards an ideal condition, followed by deposition on the surface of catalytic particles by an aerosol process. To this end, it is preferred to passivate the surface by means of etching with an acid such as HF. This has the effect that free or dangling bonds on the substrate surface are terminated with hydrogen ions. This prevents further oxide growth on the substrate surface, and maintains ideal surface conditions while aerosol deposition takes place. Aerosol deposition, and any further processing on the substrate surface takes place in accordance with the invention before any significant degradation of the passivation properties of the hydrogen termination. In practice, a time period of about 2 hours may be permissible.

As regards the catalytic particles, any metal that is commonly used for nanowhisker growth, such as Au, may be used with this invention. In particular applications where it is not desirable to use Au on silicon substrates, because of the tendency for Au to diffuse into the silicon and create deep level defects, other materials such as In or Ga may be used, where the nanowhisker to be formed contains such materials.

The catalytic particles are preferably provided on the substrate surface in the form of an aerosol deposition, as noted above. This has an advantage that very accurate control may be exerted over the size of the particles (see International Patent Application Publication No. WO 01/84238, the entirety of which is incorporated herein by reference). Alternatively, the catalytic particles may be formed by deposition from a liquid suspension (colloids from a solution), or may be defined by a NIL (nano imprint lithography) process. In yet another alternative method of forming catalytic particles, a thin film of catalytic material may be formed over substrate surface in a manner similar to that disclosed in the above-referenced publications to Hiruma et al. When the substrate is heated in an initial annealing step, the film liquifies and breaks up into catalytic particles, from which nanowhiskers may be grown.

It has been found that in order to achieve epitaxial nanowhisker growth, it is desirable to anneal the substrate surface prior to nanowhisker growth. Such annealing preferably occurs at a temperature between 600° C. and 650° C. for a silicon surface. Further, it has been found that gases containing elements for nanowhisker growth should not be present in the atmosphere surrounding the substrate during this annealing process. This is in contrast to prior procedures where it is common to expose the substrate during the annealing process to a gas containing Group V elements, such as arsenic or phosphorous.

VLS growth may occur by the chemical beam epitaxy method or MOCVD (MOVPE) method. In these methods, it is common to employ two sources of gas, one being a organometallic compound containing a metal, such as gallium or indium, that is required to form part of the nanowhisker material, and another gas containing a Group V or VI element, such as phosphine or arsine, that is desired to react with said metal to produce the compound of the nanowhisker.

In MOCVD techniques, it is common to introduce the gases together for growth. In addition, it is common to have the phosphine, arsine or similar hydride gas, introduced during the annealing step. However, in contrast to this, it has been found in accordance with the present invention that such gas should not be introduced during the annealing step.

With the above measures, it has been found that very accurately determined nanowhiskers having precise dimensions and physical characteristics can be formed on substrates of dissimilar material. In particular, materials of a III-V semiconductor material, such as indium phosphide, gallium arsenide, gallium phosphide etc., may be formed on Group IV material substrates such as silicon. Silicon substrates are especially preferred in practice of the invention, in that such substrates are inexpensive and commonly used in industry, as opposed to substrates of III-V materials that are much more expensive. Any surface of the silicon or other substrate material may, in principle, be used for whisker growth in practice of the invention, e.g. (001), (111).

It has been found that the crystalline perfection of nanowhiskers grown in accordance with the invention is such that, at the base of the nanowhisker at its junction with the substrate, crystal planes are epitaxially formed within the nanowhisker one upon the other, to form a transition of crystal material where the crystalline orientation of the substrate surface is preserved in the epitaxially grown layers of the whisker. That is to say, there is not an indistinct region of amorphous material and crystal segments at the base, between the substrate and the aligned crystal planes of the nanowhisker. Defects or dislocations may exist at the base, e.g. stacking faults, but these are not such as to disturb the essential crystallinity and the crystal directions of the substrate surface that are transferred to the epitaxial growth of the whisker. The problems of lattice mismatch are largely accommodated by radial expansion of the diameter of the base of the nanowhisker.

Accordingly, in yet another aspect, the invention provides a nanostructure comprising a nanowhisker upstanding from a substrate of silicon and having at least a base portion formed of a III-V material, wherein at a junction of the base portion with the substrate, crystal planes are epitaxially formed within the nanowhisker one upon the other, and crystallographic directions of the substrate surface are transferred to the epitaxially formed crystal planes of the nanowhisker.

It will be appreciated that with the present invention, structures and processes that have been previously proposed and demonstrated (for example, in the aforementioned U.S. patent application Ser. No. 10/613,071, published as No. 2004-0075464, and International Patent Application Publication No. WO-A-04/004927) may be more accurately and reliably implemented. In particular, the processes disclosed for forming epitaxial layers on silicon substrates may be implemented with a reduced risk of non-epitaxial growth.

The present invention is in principle applicable to any of the materials that may be used in the manufacture of nanowhiskers and substrates therefor. Such materials are commonly semiconductors formed of Group II through Group VI elements. Such elements include, without limitation, the following:

Group II: Be, Mg, Ca; Zn, Cd, Hg;
Group III: B, Al, Ga, In, Tl;
Group IV: C, Si, Ge, Sn, Pb;
Group V: N, P, As, Sb;
Group VI; O, S, Se, Te.

Semiconductor compounds are commonly formed of two elements to make III-V compounds or II-VI compounds. However, ternary or quaternary compounds are also commonly employed involving, e.g., two elements from Group II or from Group III. Stoichiometric and non-stoichiometric mixtures of elements are commonly employed.

III-V materials and II-VI materials include, without limitation, the following:

AlN, GaN, SiC, BP, InN, GaP, AlP, AlAs, GaAs, InP, PbS, PbSe, InAs, ZnSe, ZnTe, CdS, CdSe, AlSb, GaSb, SnTe, InSb, HgTe, CdTe, ZnTe, ZnO.

In accordance with the invention, a substrate may be selected from one of the above Group IV, III-V or II-VI materials, and the nanowhiskers (or at least the base portions thereof) may be selected from another of the Group IV, III-V or II-VI materials. Thus, the substrate may in principle be of Group IV, Group III-V or Group II-VI material, and the nanowhiskers may similarly be materials within these groups. Other substrates that are commonly used, such as aluminium oxide (sapphire) or silicon carbide, may also be employed in principle. In its most preferred practice, however, the invention is specifically concerned with substrates of silicon or other Group IV materials that are commonly available in the industry, and nanowhisker compounds of III-V material.

It will be understood that there may have been proposed and demonstrated other methods for producing nanowhiskers of III-V material on Group IV material, particularly those Group IV materials that are easier to work with than silicon. However, it is generally recognized that silicon is the most difficult of the Group IV materials to work with. The present invention achieves successful growth of III-V nanowhiskers on silicon, and may readily be applied to Group IV and other substrate materials generally, without the exercise of inventive ingenuity.

As one of its principal advantages, the invention demonstrates epitaxial nucleation and growth of III-V semiconductor nanowhiskers on silicon substrates. This addresses the long-time challenge of integrating high performance III-V semiconductors with mainstream silicon technology.

The present invention additionally permits the formation of light emitting or light detecting devices within nanowhiskers grown in accordance with the principles herein described. In prior U.S. patent application Ser. No. 10/613,071, published as No. 2004-0075464, to Samuelson et al., and International Patent Application Publication No. WO-A-04/004927, there are disclosed various light emitting and light detecting devices incorporated within a nanowhisker. For example, a p-n junction may be formed by doping two adjacent segments of the nanowhisker with oppositely charged dopant ions. This may be used as a light emitting diode, or as a photodetector. A heterojunction between two segments of different material within a nanowhisker may provide similar functions to a p-n junction. A segment of an optically active material forming heterojunctions with adjacent portions of the nanowhisker may form laser devices, resonant tunnelling diodes, heterobipolar transistors, and other electronic and photonic devices. Further there is disclosed a method of forming heterojunctions within a nanowhisker, which are accurately formed and may extend over a width of between one and eight atomic layers of the nanowhisker crystal. Such heterojunctions may be atomically abrupt, extending over as few as one or two atomic layers. As stated in the above referenced application U.S. patent application Ser. No. 10/613,071, "sharp heterojunction" means a transition from one material to another material over five or less atomic monolayers. However, for the purpose of the present specification, heterojunctions may extend over five or more than five atomic monolayers, but yet still provide a desired function of quantum confinement and defining a quantum well. Heterojunctions that define a quantum well may, in this specification, be referred to as "sharp."

In a further aspect, the invention permits the incorporation of double heterostructure segments in such nanowhiskers, allowing efficient room-temperature generation of light from, e.g., III-V nanowires grown on Si substrates. Advanced heterostructure devices presently realized on very expensive, silicon-incompatible III-V substrates, such as resonant tunnelling diodes, superlattice device structures and heterostructure photonic devices for on-chip communication, are, in accordance with the invention, available as complementary device technologies for integration with silicon.

Thus, in another aspect, the invention is concerned with a nanowhisker having at least a base portion of a III-V semiconductor material, and the nanowhisker being formed on a substrate of a Group IV material and including a segment of a further material disposed along the length of the nanowhisker, wherein accurately formed heterojunctions are provided at the boundaries of the segment with adjacent portions of the nanowhisker.

It has been found that such heterojunctions may be very precisely and accurately formed with sharp or abrupt junctions extending over only a few atomic lattice planes. The material of the nanowhisker in general is single crystal, single domain, pure epitaxial growth without defect or dislocation. It has been found that the optical characteristics of such nanowhiskers are very high quality, with the luminescence properties remaining constant from very low cryogenic temperatures up to room temperatures, without quenching of the luminescence. This arises, in significant part, because the confining potential of the quantum well formed by the heterojunctions bounding the segment is well defined (at least 200 meV up to 500 meV) and much greater than the thermal energy at room temperature, kT (~25 meV), so that the thermal movement of free charge carriers does not disturb the energy distributions of the carriers within the quantum well.

Thus, in a further aspect, the present invention provides a structure, including a nanowhisker formed on a substrate of a Group IV material, the nanowhisker having at least a base portion of a III-V semiconductor material and a segment of a further material disposed along the length of the nanowhisker, wherein accurately formed heterojunctions are provided at the boundaries of the segment with adjacent portions of the nanowhisker such as to create a quantum well bounding the segment, wherein the height of the quantum well is much greater than the thermal energy at room temperature so as to provide a device that is one of a photonics device and an electronics device.

Further, the luminescence properties of the segment remain essentially constant, with substantially no quenching, from cryogenic temperatures up to room temperature, thereby providing for highly reliable photonics devices. In accordance with the invention, the provision of nanowhiskers containing optically active material on a silicon substrate permits a very effective implementation of optical interconnects on a silicon chip. As processor speeds increase, a limiting factor in silicon chips is speed of transmission of optical pulses along buses formed as conductive lines on the substrate. A means of avoiding this limitation is to provide a data bus in the form of an optical interconnect comprising an optical path including a light emitter and a light receiver positioned on the substrate surface.

BRIEF DESCRIPTION OF THE DRAWINGS

Preferred embodiments of the invention will now be described with reference to the accompanying drawings.

FIG. 1A is a 45° tilt SEM image of GaP nanowires growing vertically from the Si (111) surface in the [111] direction. FIG. 1B shows a top view from the same sample, scale bar 1 μm. FIG. 1C is an HRTEM image of the Si substrate-nanowhisker interface of a nanowhisker of FIG. 1A, scale bar 10 nm. The crystal directions from the Si substrate (lower) are transferred to the nanowhisker (upper).

FIGS. 2A and 2B show modifications of the first embodiment, specifically SEM images of vertical GaAs (FIG. 2A) nanowhiskers and InP (FIG. 2B) nanowhiskers grown from and Si (111) substrate, tilt 45°, scale bars 1 μm.

In FIG. 3A, the location of the segment in the nanowire is seen as a brighter region in the mid section, scale bar 500 nm. FIG. 3B is an XEDS line scan of the GaP nanowire with GaAsP segment showing the sharp nature of the interface, scale bar 200 nm.

FIG. 4A shows room-temperature PL from standing wires as-grown on a Si(001) surface as seen from above, scale bar 5 μm. When excited with a 458 nm laser source the wires emit at 725 nm. The luminescence was visible to the naked eye and the image was recorded using a standard digital camera with 15 s integration time. FIG. 4B shows a top view SEM image of the same sample, scale bar 1 μm. Four nanowhiskers grow in the four different <111> directions. The nanowhiskers form an angle of 35.3° with the Si(001) surface as illustrated in the inset. FIG. 4C shows 10 K and room-temperature PL spectra from individual wires scraped off and resting on a SiO$_2$ surface. The luminescence from the wires remained bright at room temperature, with negligible quenching observed.

DESCRIPTION OF THE PREFERRED EMBODIMENTS

Figure 1A:
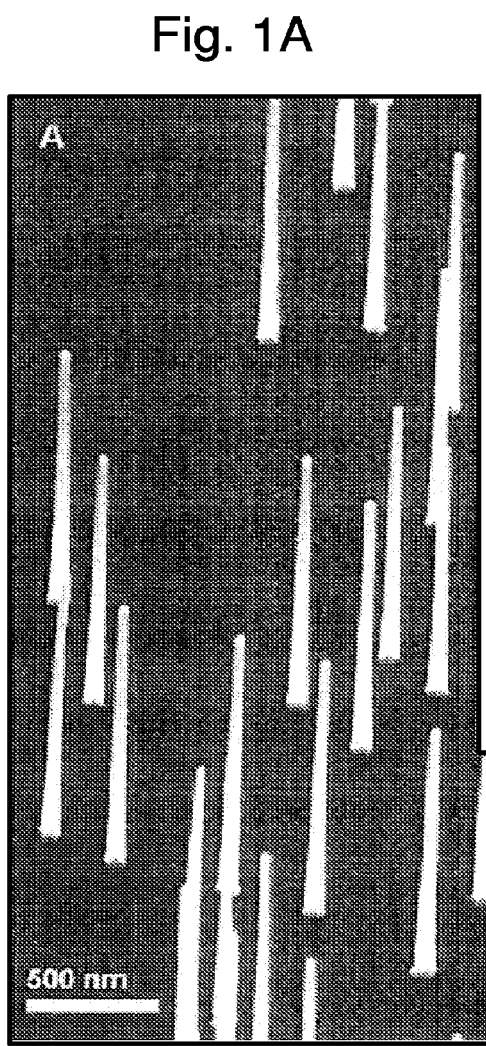
FIGS. 1A to 1C show a first embodiment of the invention, comprising growth of GaP nanowhiskers on Si (111).

The integration of III-V compound semiconductors, which are dominant in applications such as light-emitting diodes and optoelectronics, with mainstream Si technology is a long sought-after goal for the semiconductor industry. If mastered, significant limitations of the otherwise ideal Si material could be compensated: first, the low efficiency in light generation in Si and, second, the lack of a versatile heterostructure technology required for many high-speed electronic and photonic devices.

The present invention, in an especially preferred mode, provides III-V nanowhiskers (i.e., nanowhiskers of which at least the initial growth or base portion is of a III-V material) grown epitaxially on Si substrates. By the term "epitaxially," it is meant that the crystallographic directions are transferred from the substrate to the nanowhiskers. GaP has a lattice mismatch of less than 0.4% relative to Si and is therefore a preferred candidate for epitaxial growth on Si among the III-V compounds. The GaP—Si junction has applications in heterojunction bipolar transistors with GaP as large band gap emitter with sharp and ideal interfaces to Si. Successful synthesis is demonstrated of epitaxially oriented GaP nanowhiskers on Si(111) and Si(001) substrates. To demonstrate room temperature light generation on silicon, light emitting GaAsP heterostructure segments were inserted. The present invention provides epitaxial growth of nanowhiskers on Si for more heavily lattice-mismatched compounds such as InP (4.1%) and GaAs (8.1%).

In a first embodiment, size-selected gold aerosol nanoparticles were used as seeding particles for nanowire growth. Prior to aerosol deposition, the Si substrates were cleaned and organic residues removed. As a final step before deposition, the samples were treated with hydrofluoric acid to create a hydrogen-terminated surface. The samples were then immediately transferred to a controlled nitrogen atmosphere where the aerosol deposition took place. Typically, 40 nm diameter Au aerosol particles at a density of 2 μm$^{-2}$ were used. After aerosol deposition, the sample was exposed as little as possible to open air since the hydrogen-terminated surface is known to deteriorate with time. The nanowire growth was performed in a low-pressure, 10 kPa, MOVPE system. Samples were annealed at 625° C. in a hydrogen atmosphere for 10 min before growth. The temperature was then ramped down to the growth temperature of typically 475° C. Growth of GaP nanowhiskers was initiated when the precursors, trimethyl gallium and phosphine, were introduced simultaneously into the growth cell. A typical growth time was 4 min. For incorporation, in a second embodiment of the invention, of an optically active GaAsP heterosegment, arsine was switched on at a certain time during growth. The GaAs$_x$P$_{1-x}$ composition was then controlled by adjusting the arsine-to-phosphine ratio. For growth of InP and GaAs on Si, the procedure was very similar but with different temperatures and precursors as appropriate to those materials.

Figure 1B:
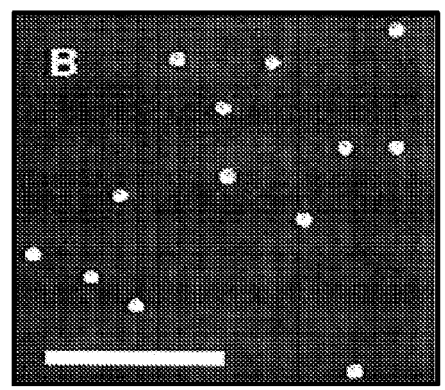
Figure 1C:
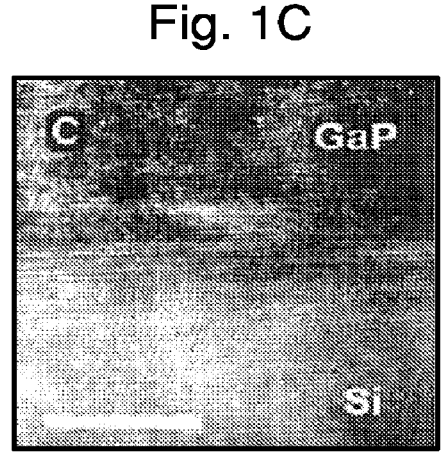

Samples were then characterized using scanning electron microscopy (SEM), transmission electron microscopy (TEM), and photoluminescence (PL) spectroscopy. Specifically, FIG. 1A shows a 45° tilt SEM micrograph of GaP nanowhiskers growing vertically from the Si(111) surface in the [111] direction. A thin planar film of GaP on the Si substrate can be seen as a corrugation of the surface between the wires. TEM investigations estimate the film thickness to be about 20 nm, i.e., the uncatalyzed planar growth rate is approximately 10$^{-2}$ of the nanowire growth rate. The wires were grown using 40 nm seed Au nanoparticles. Top wire diameter is close to 40 nm. FIG. 1B is a top view of the same sample showing the perfection in the vertical alignment. FIG. 1C is a HRTEM image of the Si substrate-GaP nanowhisker interface. The crystal directions from the Si substrate are transferred to the nanowhisker.

The preferred III-V nanowhisker growth direction in most reported cases in the literature is the [111]B direction, i.e., corresponding to vertical growth from a (111) oriented surface. The Si(111) surface actually has four possible <111> growth directions, one vertical and three forming an angle of 19.5° with the substrate surface, distributed 120° apart azimuthally. Only the vertical [111] direction is observed, which is expected if the gold-silicon interface is flat, as the only facet available for nucleation is then the (111) facet, the other facets simply not being present during nucleation. This is indisputably the case when looking at FIGS. 1A and B and clearly demonstrates the perfect epitaxial nature of the growth. Well-aligned vertically oriented nanowhiskers were reproducibly obtained in a large number (20+) of growth runs.

To investigate the interface between the Si substrate and the GaP nanowire, samples were prepared for high-resolution transmission electron microscopy (HRTEM) by cleaving polishing, and ion milling the silicon substrate after wire growth (FIG. 1C). The transfer of crystallographic information from the Si substrate to the GaP nanowhiskers can clearly be seen, in that the crystal directions of the Si substrate are transferred to the epitaxial layers at the base of the nanowhisker.

In modifications of the first embodiment, III-V compounds with a large lattice mismatch such as GaAs (FIG. 2A) and InP (FIG. 2B), with lattice mismatch of 4.1% and 8.1% respectively, are also be grown epitaxially on Si. Specifically, FIGS. 2A and 2B show SEM images of vertical (A) GaAs nanowhiskers and (B) InP nanowhiskers grown on Si(111) substrates. The small wire cross-section enables the wires to accommodate and relax strain from the large lattice misfits of otherwise incompatible materials.

It was found that passivation (e.g., hydrogen passivation) of the Si surface is particularly advantageous. On samples where the native oxide was not removed prior to aerosol deposition, no epitaxial orientation was observed. It was also noticed that for samples that were kept in a glovebox atmosphere for a longer time (~3 months), the yield of straight epitaxial wires was lower than from freshly prepared samples. As the reoxidation of the HF-etched surface is moderately slow, this suggests that even a very thin layer of native oxide is detrimental to epitaxial wire growth.

EXAMPLES

Starting material was "Toyo" Epitaxial Silicon Wafers, P type substrate with a P type epilayer orientation (111).

|  | Dopant | Resistivity | Thickness |
| --- | --- | --- | --- |
| Substrate | Boron | <0.015 Ω cm | 245 μm |
| Layer | Boron | 12 Ω cm | 27 μm |

Preparation Prior to Growth

1) Clean with ultrasonic Tri-clean to remove organic residues and particles.

The wafer was placed in a test tube and solution a) below was added. The test tube was put in ultrasonic bath at 35 KHz for 2-3 minutes. After, the bath the solution was decanted and the next solution was added. The process repeated for solutions b)-d) in that order.
  a) Trichloroethylene (proanalysi)
  b) Acetone (proanalysi)
  c) Ethanol (95%)
  d) Milli-Q-$H_2O$
The water was decanted and refilled 2-3 times in Milli-Q-$H_2O$ (18.2 W cm 25° C.). Rinse the wafer.

2) The wafer was removed from the rinse water and immediately cleaned with Piranha Etch to remove any remaining organic residues.

The following were measured and mixed in a separate container:
  7 parts sulphuric acid (95-97% proanalysi)
  3 parts hydrogen peroxide (30% proanalysi)
When mixed, an exothermic reaction causes the solution to heat to over 70° C. This mixture was poured over the samples and was stirred occasionally for 6 min.

The Piranha Etch was decanted and the wafer was rinsed as before 3-4 times.

3) The wafer was taken directly from the rinsing water and put in a Hydrofluoric acid (HF) dip to remove silicon dioxide on the surface.

A 5% HF solution was prepared by measuring and mixed in a separate container:
  1 part HF (40% proanalysi)
  7 parts in Milli-Q-$H_2O$ (18.2 M W cm 25° C.)
The solution was stirred occasionally for 2 min.

The wafer was removed from the HF solution and care was taken that there were no visible droplets remaining on the polished side of the wafer. The backside of the wafer was blotted on a filter paper to remove any liquid on the backside of the wafer. It was then transferred directly into an atmospherically controlled glove box ($H_2O$ and $O_2$ levels<1 ppm) via a load lock for the aerosol deposition.

A standard aerosol particle diameter of 40 nm was used with particle surface densities ranging from ~0.05 to 40 $\mu m^{-2}$.

After aerosol deposition, the samples were stored up to 2 weeks in an atmospherically controlled glove box until they were transferred in air to the MOVPE glove box chamber for loading and growth.

The samples were then mounted in the growth chamber of the MOVPE system (low pressure 100 mbar).

A typical growth run, GaP nanowhiskers:

1. Temperature was raised to an annealing temperature of 625° C. and annealed for 10 min under hydrogen atmosphere. Temperature was ramped down linearly during 5 min to growth temperature, 475° C.

2. Growth started when the two sources, TMG and phosphine were simultaneously introduced in the growth chamber. The molar fraction source flows were $1.5 \times 10^{-2}$ for phosphine and $1.25 \times 10^{-5}$ for TMG in 6 l/min hydrogen. A typical growth time was 4 minutes.

3. Growth stops when the TMG is switched off. The temperature is then lowered and the phosphine is switched off as temperature drops below 300° C.

Comments to the Procedure Described Above:
  The HF-etch creates a hydrogen-terminated surface, i.e., a hydrogen atom is attached to each dangling bond of the Si (111) surface. Other surface preparations such as no cleaning at all, organic clean but no oxide removal, did not produce good wire growth. As a hydrogen terminated surface is oxidized over time, it is preferable to use freshly prepared samples. Samples kept in a glove box atmosphere for ~3 months produced lower quality wires than freshly prepared samples.
  Annealing temperature was found to be an important parameter for the wire quality and investigated temperatures in the range 550 to 700° C. A high annealing temperature (700° C.) gave wires with a heavy base and irregular nucleation, resulting in many small wires around the main stem as well as many wires creeping along the surface with no orientation. A low annealing temperature (550° C.), on the other hand, resulted in loss of the epitaxial orientation from the substrate, i.e., the wires were no longer vertically aligned but had a random orientation. At this low temperature, many gold particles also did not nucleate to form wires but remained as dead particles lying on the surface. 625° C. was found to be a suitable compromise between the two extremes above.
  It was observed that if the phosphine was activated during the annealing step, as is the conventional procedure when growing GaP nanowhiskers on GaP substrates, there was no wire growth.

FIGS. 1A to 1C show GaP nanowhiskers grown on a silicon substrate. The formation of the nanowhiskers is ideal, with the nanowhiskers exhibiting perfect regularity. In general, the achievement of ideal nanowhiskers is due to the formation of perfect conditions for nanowire growth, including atomically flat surfaces with no impurity or oxide formation that might give rise to bulk growth and that might inhibit factors that promote nanowhisker growth.

Referring to FIGS. 3A and 3B and 4A to 4C, in a second embodiment of this invention, light-emitting segments of $GaAs_xP_{1-x}$ were inserted in GaP wires grown on Si. The composition can be tuned by controlling the arsenic to phosphorus ratio during growth, and the length of the segment is determined by the growth time.

The method of forming the nanowhiskers was essentially the same as that in Example 1, but conditions are changed during growth to produce the gallium arsenide phosphide heterojunctions. The procedure for changing conditions is described in earlier mentioned U.S. patent application Ser. No. 10/613,071, published as No. 2004-0075464, to Samuelson et al.

Figure 4A:
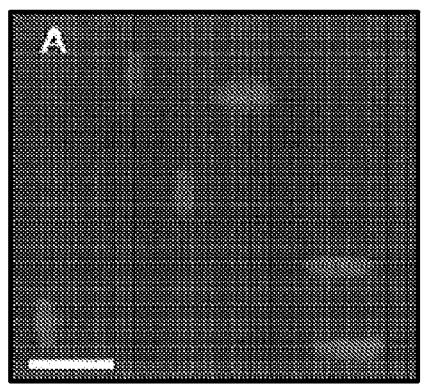
FIGS. 4A to 4C show photoluminescence from the nanowhiskers of FIG. 3.
Figure 4B:
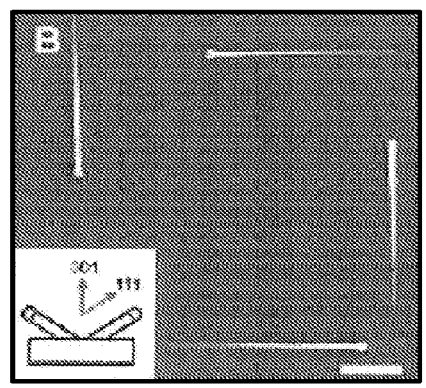
Figure 4C:
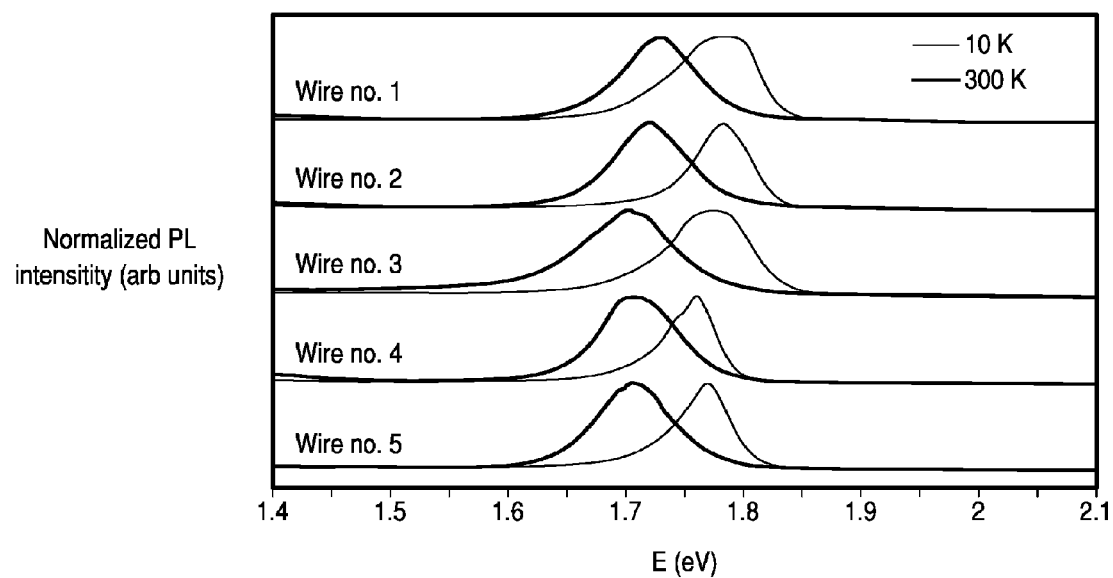

Using Si(001) substrates, the nanowhiskers grew in four different <111> directions (FIG. 4B). On the (001) surface orientation, four equivalent <111> directions make an angle of 35.3° with the substrate distributed 90° apart azimuthally. For epitaxial growth, all four directions can be expected since the <111> directions are equivalent.

Figure 3A:
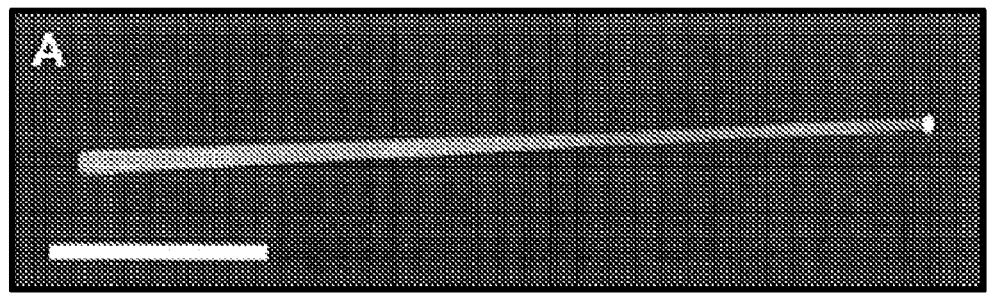
FIGS. 3A and 3B show a second embodiment of the invention, HAADF STEM images of a light-emitting GaAsP segment incorporated in a GaP nanowire during growth. The segment is approximately 500 nm long corresponding to a growth time of 1 min of a total of 5 min.
Figure 3B:
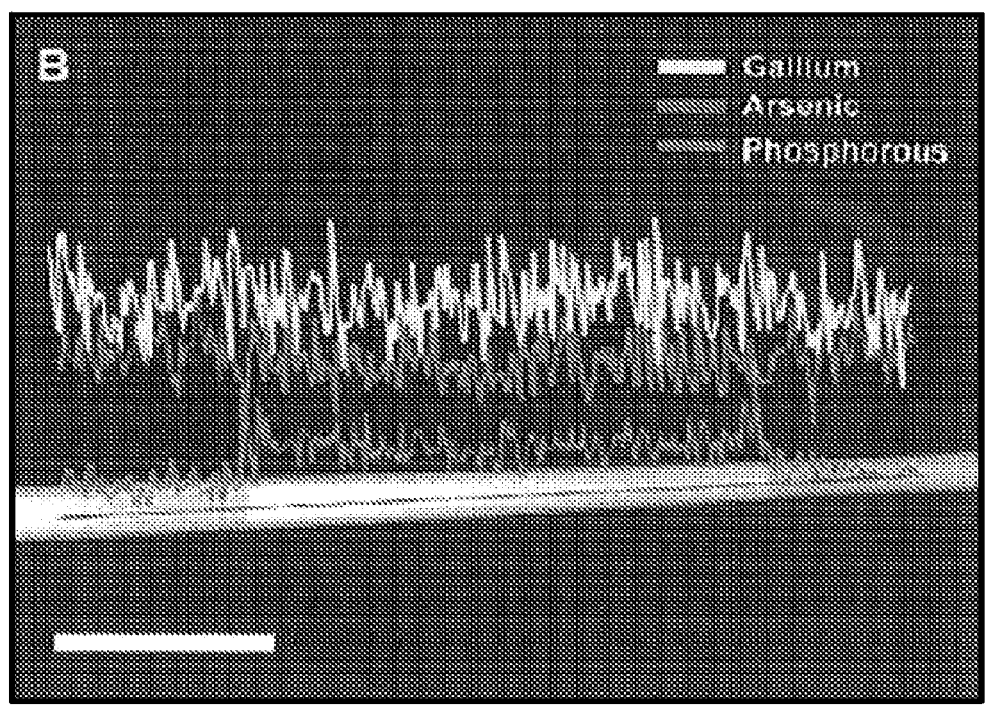

FIG. 3A shows a high angle annular dark-field scanning transmission electron microscopy (HAADF-STEM) image of a GaP nanowire with a 500 nm long segment of $GaAs_xP_{1-x}$. An X-ray energy dispersive spectrometry (XEDS) composition line scan of the segment (FIG. 3B) shows that the interfaces are very sharp. From XEDS composition analysis, a composition of ~30% P and ~70% As in the segment can be inferred. The phosphorous content of the GaAsP segment measured with XEDS is probably somewhat higher than that of the actual segment core; after growth of the segment, a thin shell of GaP is deposited over the GaAsP core due to lateral growth when the end part of the GaP nanowire is grown.

The optically active segments were characterized using PL spectroscopy and PL imaging. FIG. 4A shows room temperature luminescence imaging in the deep red spectral region (725 nm) from standing wires, as grown on Si (001). The nanowhiskers were excited using an Ar+ laser, emitting at 458 nm and with an intensity of approximately 3 kW/cm$^2$. A sample with a low wire density of ~0.05 μm$^{-2}$ was used to make it possible to resolve individual wires. The (001) substrate orientation was chosen to ease the collection of the light since light is mainly emitted in lobes from the segment and the light is collected from above. The elongations of the spots in two perpendicular directions correspond to the projection of the four different <111> directions (FIG. 4B). The fact that luminescence of individual nanowhiskers can be imaged at room temperature suggests that the radiative recombination from GaP/GaAsP/GaP double heterostructure segments is not thermally quenched even at room temperature.

For a detailed PL-spectroscopy study, standing nanowhiskers were scraped off from a (111) substrate and transferred to a grid-patterned SiO$_2$ surface. The advantage of placing the nanowhiskers on the grid structure is that, after PL spectroscopy, each wire can be located with SEM to confirm that it is a single wire with a well-defined segment. PL spectra from separate nanowhiskers were recorded at 10° K and room temperature, demonstrating high uniformity (FIG. 4C) in the luminescence from the individual wires. The GaP/GaAsP/GaP nanowhiskers exhibit sharp peaks at about 1.78 eV with a full width half-maximum (fwhm) of about 60 meV at 10° K. The PL remains bright at room temperature with peaks shifted to 1.71 eV and with an average fwhm of about 75 meV, with negligible quenching of the emission. The spectral shift corresponds well with the band-gap shrinkage from 10° K to room temperature. Comparing the PL spectra with data in the literature for bulk GaAsP, a composition of $GaAs_{0.8}P_{0.2}$ can be inferred, in reasonable agreement with the XEDS composition analysis. By changing the $As_xP_{1-x}$ composition in the segment, it is possible to continuously tune the emitting wavelength from the band gap of GaP to the band gap of GaAs, representing a wavelength span of 550-900 nm, corresponding to the spectral range achieved in GaAsP LED technology for growth on GaP.

Among its most important advantages, the present invention provides device-quality III-V semiconductor growth on silicon substrates with perfect epitaxial nucleation of oriented III-V nanowhiskers. The present invention additionally demonstrates visible room-temperature luminescence of heterostructure III-V nanowhiskers formed on silicon substrates as bright as at cryogenic temperatures.

The invention claimed is:

1. A structure, comprising a nanowhisker having at least a base portion of a III-V semiconductor material, the nanowhisker being formed on a substrate of a Group IV material and including a segment of further material disposed along a length of the nanowhisker, wherein heterojunctions are provided at boundaries of the segment with adjacent portions of the nanowhisker so as to create a quantum well bounding the segment, wherein a height of the quantum well is substantially greater than a thermal energy at room temperature, whereby to provide a device that is one of a photonic device and an electronic device;
    wherein the nanowhisker is formed of GaP, and said segment is formed of GaAsP.

2. A structure according to claim 1, wherein luminescence properties of the segment remain substantially constant from cryogenic temperatures up to room temperature.

3. A structure according to claim 1, wherein the substrate is of silicon.

4. A structure, comprising a nanowhisker upstanding from a substrate of silicon and having at least a base portion formed of a III-V material, wherein at a junction of the base portion with the substrate, crystal planes are epitaxially formed within the nanowhisker one upon the other, and crystallographic directions of the substrate surface are transferred to the epitaxially formed crystal planes of the nanowhisker;
    wherein the nanowhisker includes one of a p-n junction and a heterojunction disposed along a length of the nanowhisker;
    wherein the nanowhisker includes a segment of a further material disposed along the length of the nanowhisker, and wherein heterojunctions are provided at boundaries of the segment with adjacent portions of the nanowhisker so as to create a quantum well bounding the segment, a height of the quantum well being sufficiently greater than a thermal energy at room temperature such that luminescence properties of the segment exhibit substantially no quenching from cryogenic temperatures up to room temperature, whereby to form a photonic device.

5. A structure, comprising a nanowhisker upstanding from a substrate of silicon and having at least a base portion formed of a III-V material, wherein at a junction of the base portion with the substrate, crystal planes are epitaxially formed within the nanowhisker one upon the other, and crystallographic directions of the substrate surface are transferred to the epitaxially formed crystal planes of the nanowhisker;
    wherein the nanowhisker includes one of a p-n junction and a heterojunction disposed along a length of the nano-whisker;

wherein the nanowhisker includes a segment of a further material disposed along the length of the nanowhisker, wherein heterojunctions are provided at boundaries of the segment with adjacent portions of the nanowhisker so as to create a quantum well bounding the segment, a height of the quantum well substantially greater than a thermal energy at room temperature, whereby to form a device that is one of a photonic device and an electronic device.

* * * * *